US012581703B2

(12) United States Patent
Chen et al.

(10) Patent No.: US 12,581,703 B2
(45) Date of Patent: Mar. 17, 2026

(54) MULTILAYER GATE ISOLATION STRUCTURE

(71) Applicant: Taiwan Semiconductor Manufacturing Company, Ltd., Hsinchu (TW)

(72) Inventors: Hong-Chih Chen, Changhua County (TW); Wei-Chih Kao, Taipei (TW); Chun-Yi Chang, Hsinchu City (TW); Yu-San Chien, Hsinchu City (TW); Hsin-Che Chiang, Taipei City (TW); Chun-Sheng Liang, Puyan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 860 days.

(21) Appl. No.: 17/846,948

(22) Filed: Jun. 22, 2022

(65) Prior Publication Data

US 2023/0420505 A1     Dec. 28, 2023

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 84/01* | (2025.01) |
| *H10D 84/03* | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01);

*H10D 62/115* (2025.01); *H10D 84/0128* (2025.01); *H10D 84/0151* (2025.01); *H10D 84/038* (2025.01)

(58) Field of Classification Search
CPC ............. H10D 62/121; H10D 84/0151; H10D 84/0128; H10D 84/038; H10D 62/115; H10D 30/014; H10D 30/6757; H10D 30/6735; H10D 30/43
USPC ....................................................... 257/288
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |

(Continued)

*Primary Examiner* — Eric W Jones

(74) *Attorney, Agent, or Firm* — Birch, Stewart, Kolasch & Birch, LLP

(57) ABSTRACT

Structures and formation methods of a semiconductor device structure are provided. The semiconductor device structure includes first and second gate structures formed over a semiconductor substrate and a multilayer gate isolation structure separating the first gate structure from the second gate structure. The multilayer gate isolation structure includes a first insulating feature adjacent to upper portions of the first gate structure and the second gate structure, and a second insulating feature separating the semiconductor substrate from the first insulating feature. The material of the second insulating feature is different than that of the first insulating feature. The second insulating feature has a lower dielectric constant or lower etch resistance than the first insulating feature.

20 Claims, 27 Drawing Sheets

(56) References Cited

U.S. PATENT DOCUMENTS

| | | | | |
|---|---|---|---|---|
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,629,742 | B2 * | 4/2020 | You | H10D 84/0193 |
| 2019/0067128 | A1 * | 2/2019 | Chang | H10D 84/0172 |
| 2019/0189804 | A1 * | 6/2019 | You | H10D 84/0151 |
| 2019/0393352 | A1 * | 12/2019 | Guha | H10D 30/6735 |
| 2020/0035705 | A1 * | 1/2020 | Kim | H10D 64/017 |
| 2020/0098878 | A1 * | 3/2020 | Guler | H10D 84/834 |
| 2020/0105752 | A1 * | 4/2020 | Liaw | H10D 30/6757 |
| 2021/0126109 | A1 * | 4/2021 | Lin | H10D 84/038 |

* cited by examiner

MULTILAYER GATE ISOLATION STRUCTURE

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations.

In the course of IC evolution, functional density (i.e., the number of interconnected devices per chip area) has generally increased while geometric size (i.e., the smallest component (or line) that can be created using a fabrication process) has decreased. However, challenges from both fabrication and design issues have resulted in the development of three-dimensional design (e.g., the fin field effect transistor (FinFET) or gate-all-around (GAA) transistor).

Although existing three-dimensional transistors and methods of fabricating those transistors have been generally adequate for their intended purposes, they have not been entirely satisfactory in all respects. For example, during the formation of the transistors, a long gate structure which is shared between two or more transistors may be patterned to form shorter gate structures. The space formed by the removed portions of the gate structure is subsequently filled with a dielectric material affecting the device performance by undesirable leakage and parasitic capacitance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2I show cross-sectional views of various stages of forming a semiconductor device structure with a multilayer gate isolation structure separating FinFET transistor structures, in accordance with some embodiments, in which FIG. 2A is a schematic cross-sectional view showing the semiconductor device structure taken along the line I-I' in FIG. 1H.

DETAILED DESCRIPTION

Figure 1A:
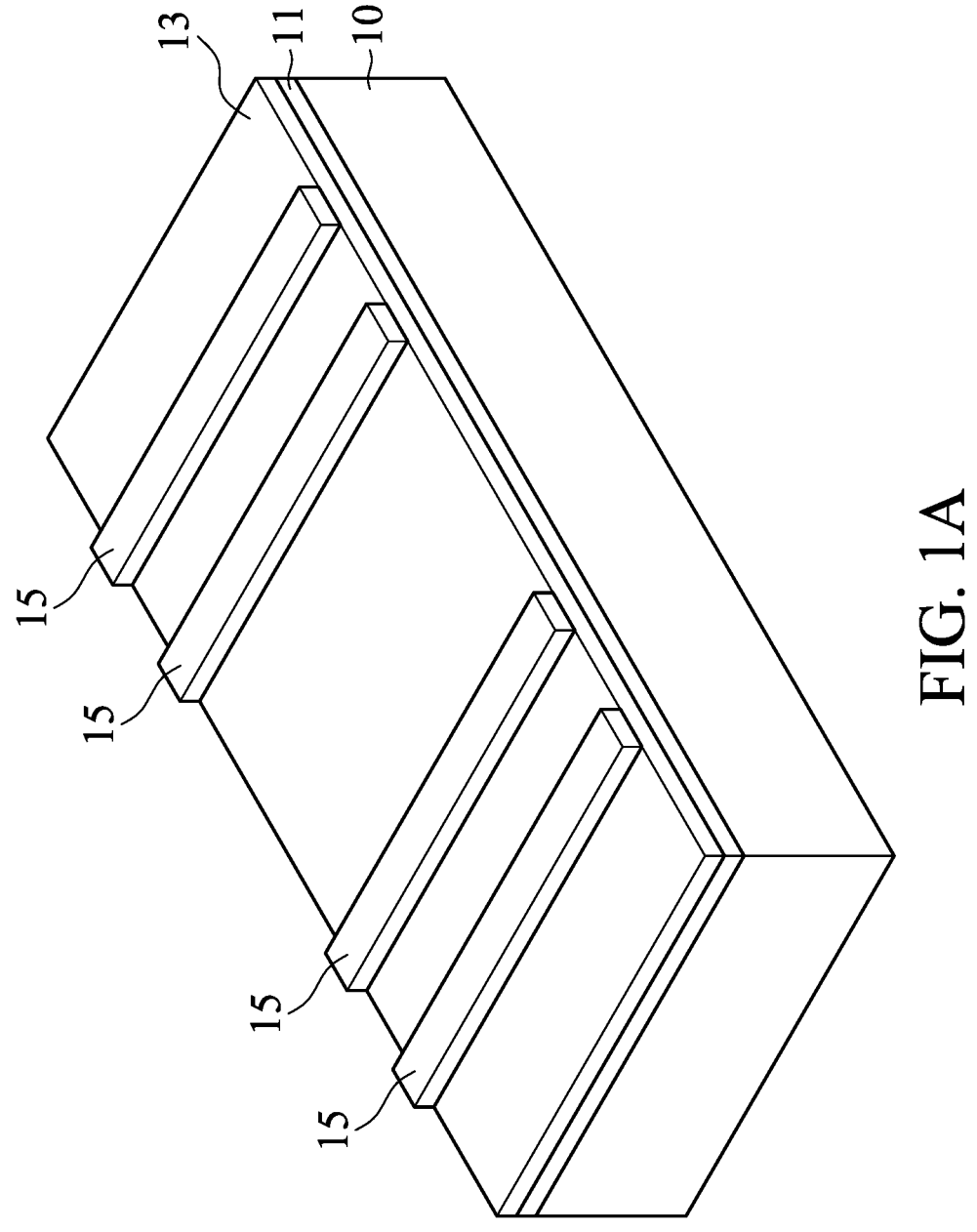
FIGS. 1A to 1H show perspective representations of various stages of forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x:5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs or gate-all-around field effect transistors (GAA FETs). The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor device structure and a method of forming a semiconductor device structure are provided. FIGS. 1A to 1H show perspective representations of various stages of forming a fin field effect transistor (FinFET) structure, in accordance with some embodiments of the disclosure. In some embodiments, a semiconductor substrate 10 is provided, as shown in FIG. 1A. The semiconductor substrate 10 may be doped or undoped, or an active layer of a semiconductor-on-insulator (SOI) substrate. Alternatively or additionally, the semiconductor substrate 10 may include other elementary semiconductor materials such as germanium. In some embodiments, the semiconductor substrate 10 is made of a compound semiconductor such as silicon carbide, gallium arsenic, indium arsenide, or indium phosphide. In some embodiments, the semiconductor substrate 10 is made of an alloy semiconductor such as silicon germanium, silicon germanium carbide, gallium arsenic phosphide, or gallium indium phosphide. In some embodiments, the semiconductor substrate 10 includes an epitaxial layer. For example, the semiconductor substrate 10 has an epitaxial layer overlying a bulk semiconductor. Other substrates, such as multilayered or gradient substrates, may also be used.

In some embodiments, a mask structure is formed over the semiconductor substrate 10. The mask structure includes a first masking layer 11 and an overlying second masking layer 13 that stacked over the semiconductor substrate 10 for the subsequent patterning process, in accordance with some embodiments. More specifically, the first masking layer 11 may be used as an etch stop layer when the second masking layer 13 is patterned. The first masking layer 11 may also be used as an adhesion layer that is formed between the semiconductor substrate 10 and the second masking layer 13. For example, the first masking layer 11 may be made of silicon oxide and the second masking layer 13 is made of silicon oxide, silicon nitride, silicon oxynitride, or another applicable material. Moreover, the first masking layer 11 may be formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process. Similarly, the second masking layer 13 may be formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

Afterwards, a patterned resist layer 15 is formed over the second masking layer 13 for subsequent definition of one or more fin structures in the semiconductor substrate 10. The patterned resist layer 15 may be formed by a photolithography process. Typically, the photolithography process may include photoresist coating (e.g., spin-on coating), soft baking, mask aligning, exposure, post-exposure baking, developing the photoresist, rinsing and drying (e.g., hard baking).

Figure 1B:
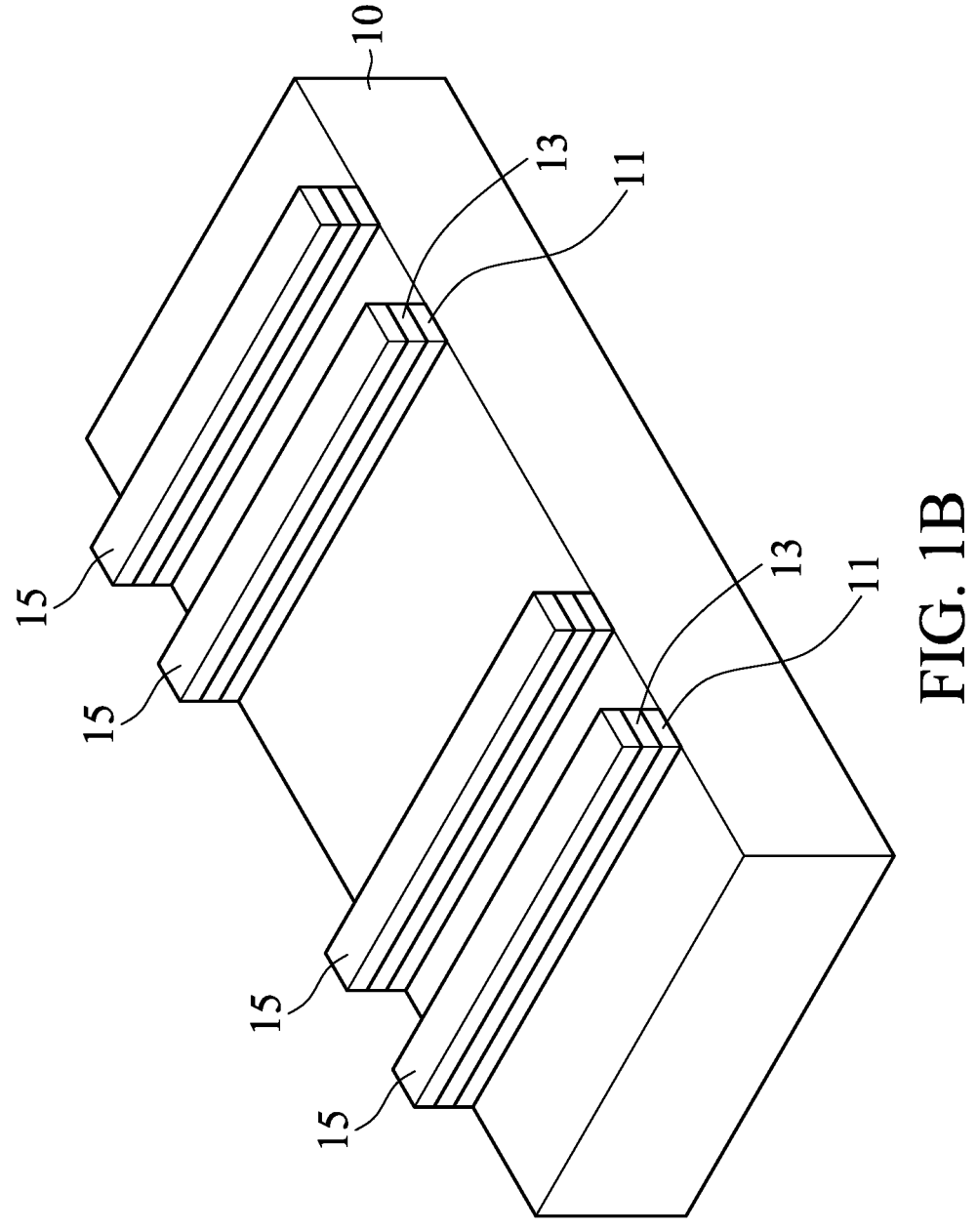

In some embodiments, the first masking layer 11 and the second masking layer 13 of the mask structure are patterned by using the patterned resist layer 15 as an etch mask, as shown in FIG. 1B. As a result, the patterned first masking layer 11 and the patterned second masking layer 13 are formed over the semiconductor substrate 10, so as to expose portions of the semiconductor substrate 10.

Figure 1C:
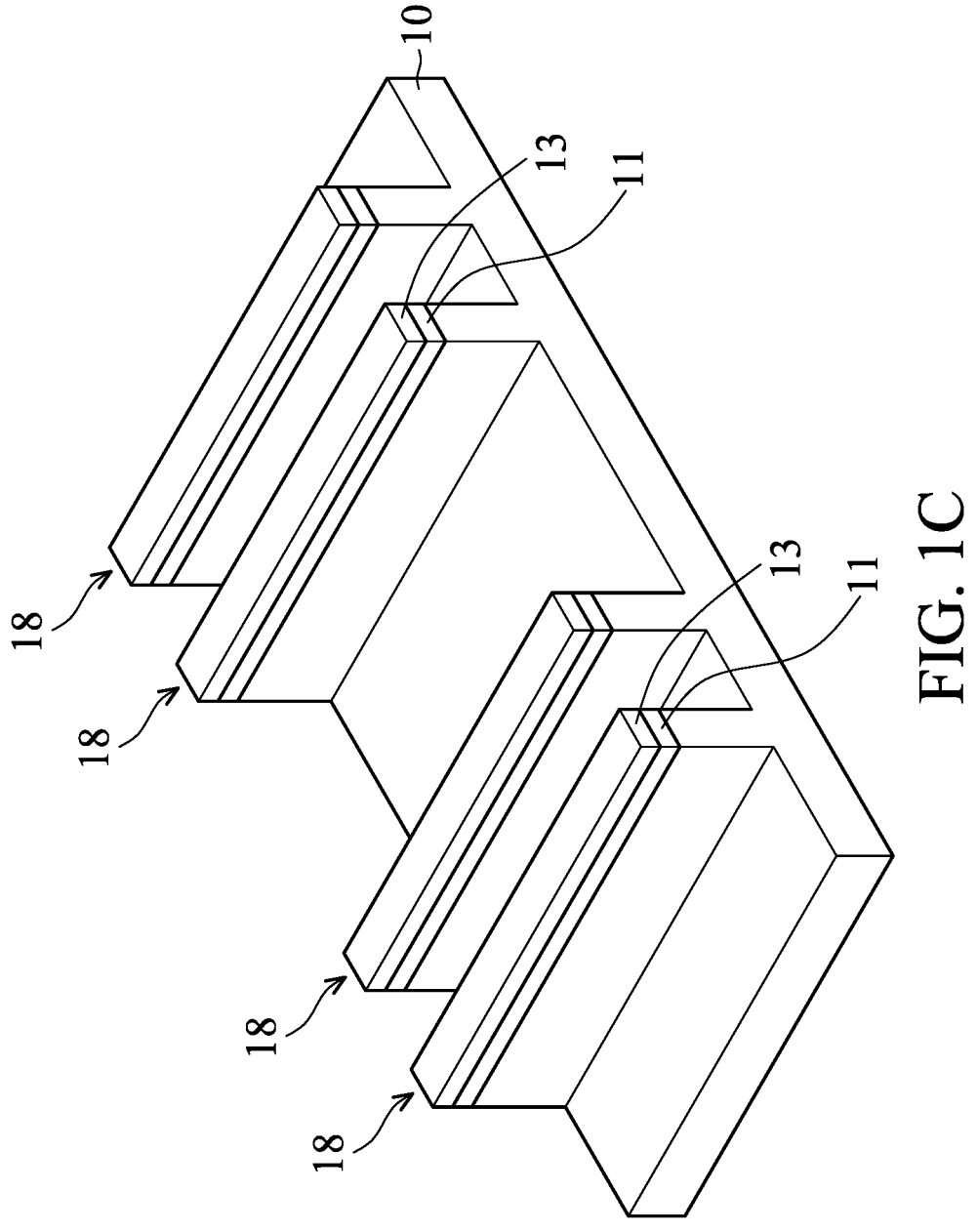

After the patterned first masking layer 11 and the patterned second masking layer 13 are formed and the portions of the semiconductor substrate 10 are exposed, the patterned resist layer 15 is removed. Afterwards, in some embodiments, the exposed portions of the semiconductor substrate 10 are partially removed by an etching process using the patterned second masking layer 13 and the patterned first masking layer 11 as an etch mask. As a result, fin structures and trenches in the semiconductor substrate 10 are formed, as shown in FIG. 1C. In order to simplify the diagram, four fin structures 18 that protrude or extend from the semiconductor substrate 10 are depicted as an example. The fin structures 18 serve as one or more channel feature for the subsequent formed transistor device(s).

In some embodiments, the etching process for formation of fin structures 18 is a dry etching process or a wet etching process. For example, the semiconductor substrate 10 is etched by a dry etching process, such as a reactive ion etching (RIE), neutral beam etching (NBE), the like, or a combination thereof. The etching process may be a time-controlled process, and continue until the fin structures 18 are formed and reach a predetermined height. A person of ordinary skill in the art will readily understand other methods of forming the fin structures, which are contemplated within the scope of some embodiments.

Figure 1D:
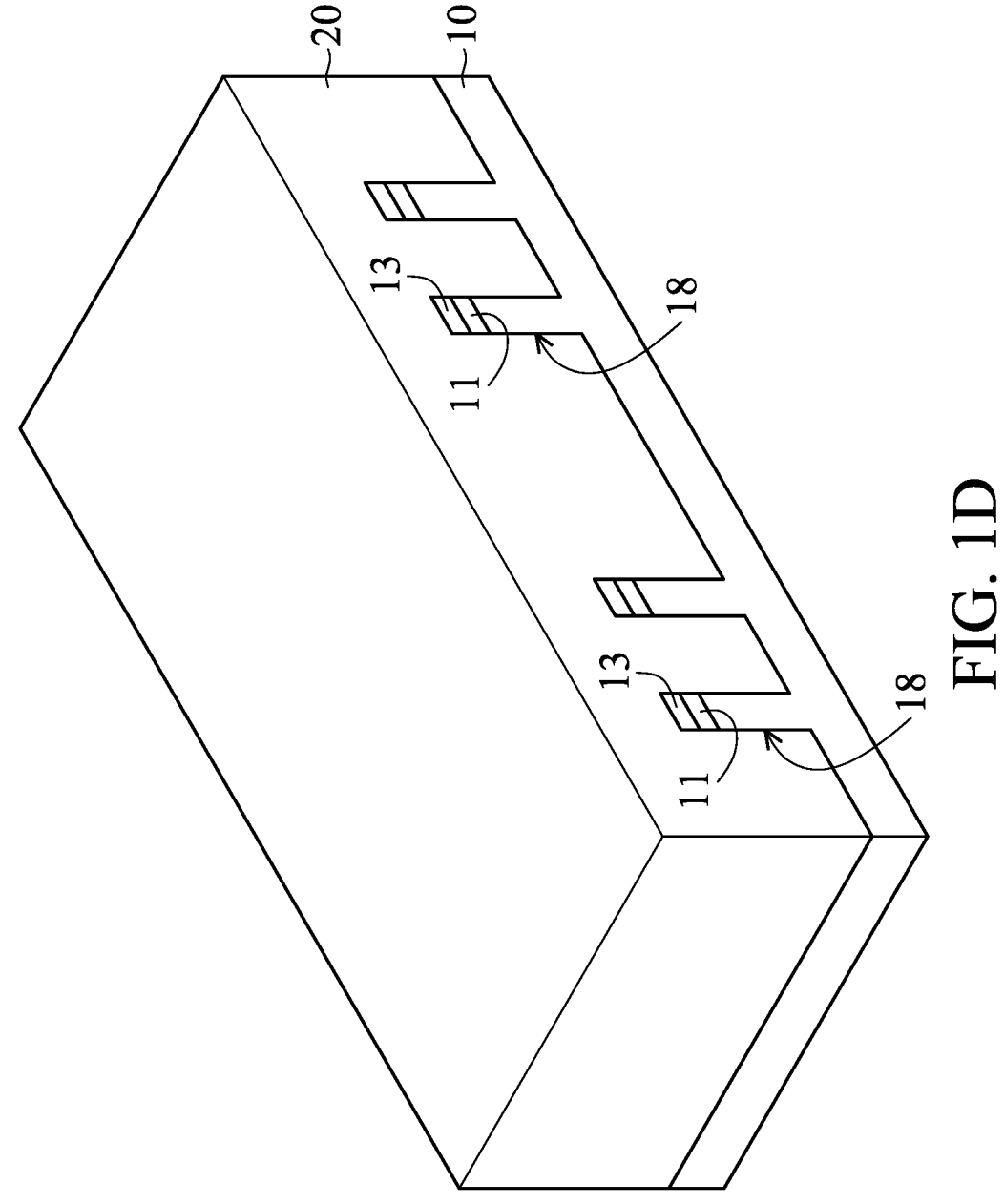

Afterwards, an insulating layer 20 is formed over the semiconductor substrate 10 to cover the fin structures 18, as shown in FIG. 1D in accordance with some embodiments. In some embodiments, the insulating layer 20 is made of silicon oxide, fluoride-doped silicate glass (FSG), a low-k dielectric material, and/or another suitable dielectric material or another low-k dielectric material. The insulating layer 20 may be deposited by a chemical vapor deposition (CVD) process, a flowable CVD (FCVD) process, a spin-on-glass process, or another applicable process.

In some other embodiments, before the insulating layer 20 is formed, one or more insulating liners (not shown) are formed on the sidewalls of the fin structures 18 and the bottom of the trenches in the semiconductor substrate 10. Such insulating liner(s) may be formed of silicon oxide, silicon nitride, silicon oxynitride, silicon carbide (SiC), or a combination thereof and may be deposited by a chemical vapor deposition (CVD) process or another applicable process.

In some embodiments, the insulating layer 20 is then recessed. More specifically, the insulating layer 20 above the top surface of the patterned second masking layer 13 may be removed (e.g., etched back) by a chemical mechanical polishing (CMP) process. In accordance with some embodiments, after the top surface of the patterned second masking layer 13 is exposed, the patterned second masking layer 13 and the patterned first masking layer 11 are removed by one or more etching processes. As a result, the top surfaces of the fin structures 18 are exposed. For example, the patterned second masking layer 13 and the patterned first masking layer 11 may be removed by a dry etching process, a wet etching process, or a combination thereof.

Figure 1E:
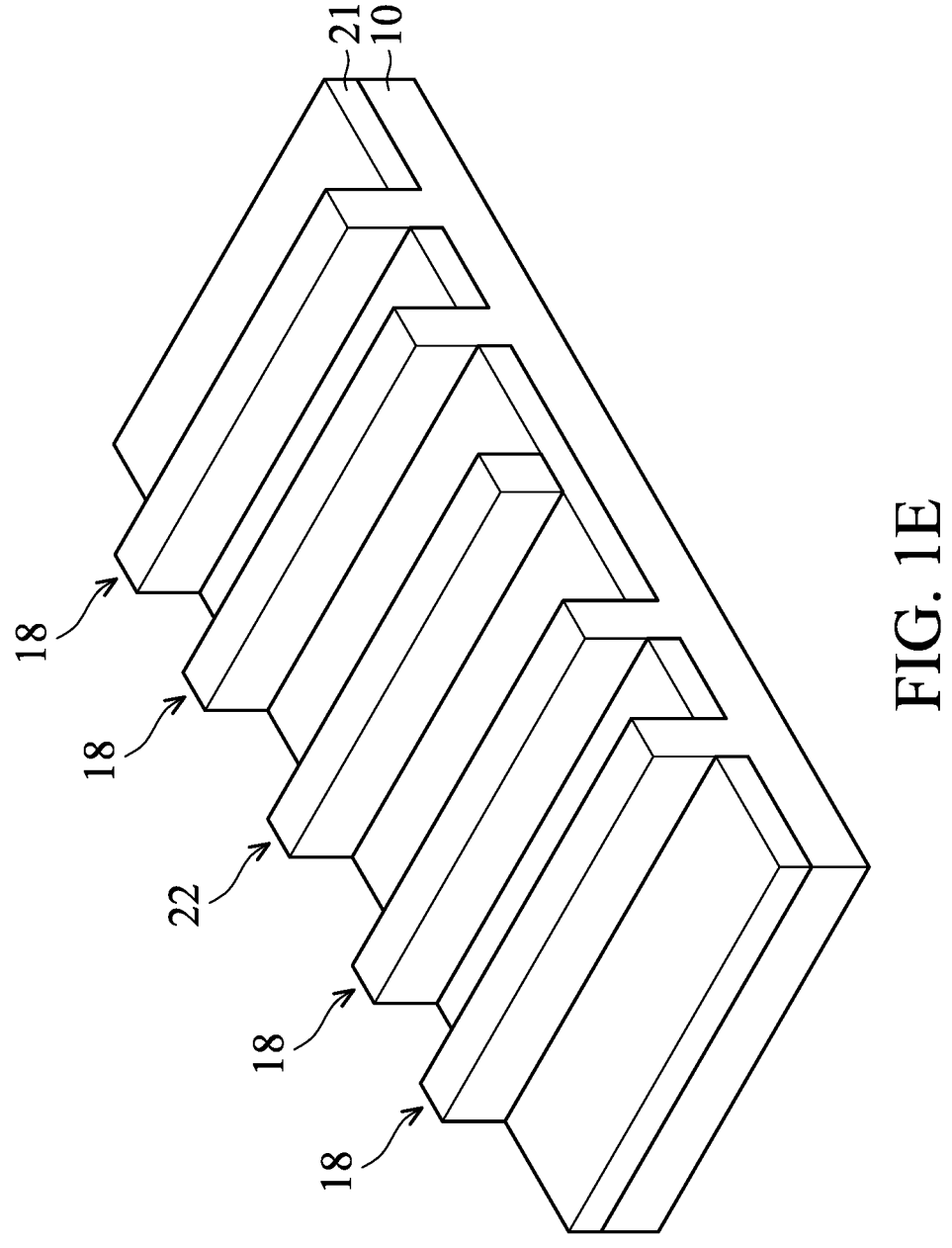

In accordance with some embodiments, the insulating layer 20 is further recessed to form isolation structures 21, as shown in FIG. 1E. In other words, the isolation structure 21 includes the remaining insulating layer 20 and the insulating liner(s) (not shown) surrounding the remaining insulating layer 20. For example, the isolation structures 21 may be shallow trench isolation (STI) structures surrounding the fin structures 18. Portions of the fin structures 18 are embedded in the isolation structures 21, so that the upper portions of the fin structures 18 protrude above the isolation structures 21.

After the isolation structures 21 are formed, an insulating layer 22 is formed over the semiconductor substrate 10 and between two adjacent fin structures 18, as shown in FIG. 1E, in accordance with some embodiments. In some embodiments, the insulating layer 22 is formed over and in direct contact with the top surface of the semiconductor substrate 10, as shown in FIG. 1E. In some other embodiments, the insulating layer 22 is formed over the semiconductor substrate 10 with passing through the isolation structure 21, so that the insulating layer 22 is in contact with the top surface of the semiconductor substrate 10. The insulating layer 22 may have a strip shape that is similar to the shape of the fin structures 18. Therefore, the insulating layer 22 may be referred to as an insulating/isolation feature or a dummy feature (e.g., isolation layer or dummy fin). The insulating/isolation feature 22 is spaced apart from the fin structures 18 and extends along a direction that is substantially parallel to the extending direction of the fin structures 18.

In some embodiments, the insulating/isolation feature 22 serves as a portion of a multilayer gate isolation structure and is made of a nitride-based material, such as silicon carbon nitride, silicon oxynitride, or the like. In some embodiments, the insulating/isolation feature 22 is formed by chemical vapor deposition (CVD), physical vapor deposition, (PVD), or another applicable process.

In some other embodiments, the insulating/isolation feature 22 is made of a high-k dielectric material such as metal oxide in accordance with some embodiments. Examples of high-k dielectric materials include hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material.

Figure 1F:
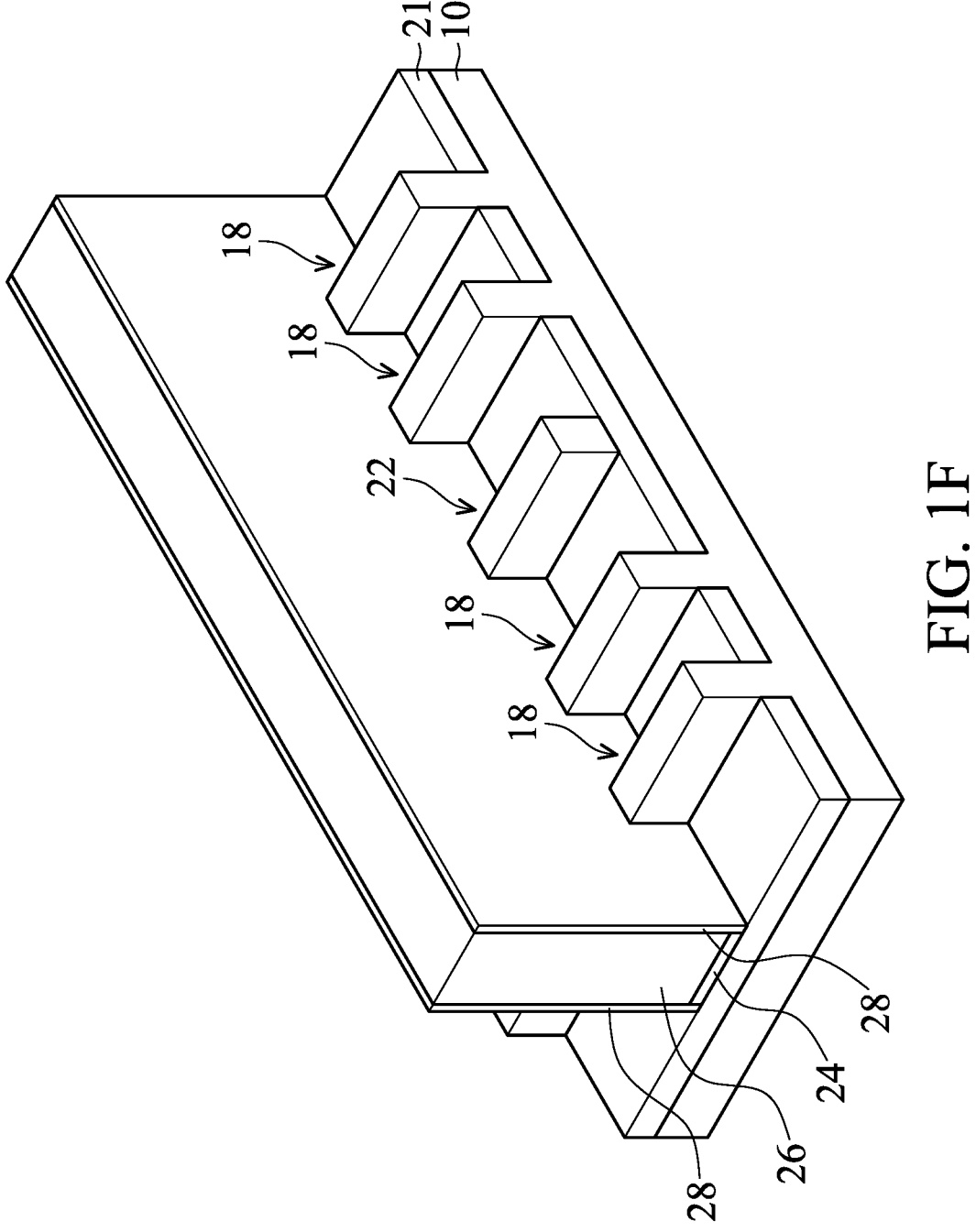

Afterwards, a dummy gate structure is formed over the isolation structures 21 and across the fin structures 18 and the insulating/isolation feature 22 (i.e., the dummy fin), as shown in FIG. 1F in accordance with some embodiments. In some embodiments, the dummy gate structure includes an optional dummy gate dielectric layer 24 and a dummy gate electrode layer 26 over the dummy gate dielectric layer 24. The dummy gate dielectric layer 24 may be made of a high-k dielectric material such as metal oxide. Examples of high-k dielectric materials may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material. The dummy gate dielectric layer 24 may be formed by chemical vapor deposition (CVD), physical vapor deposition, (PVD), atomic layer deposition (ALD), or another applicable process.

After the dummy gate dielectric layer 24 is formed, the dummy gate electrode layer 26 is formed over dummy gate dielectric layer 24. For example, the dummy gate electrode layer 26 may be made of polysilicon. Afterwards, the dummy gate dielectric layer 24 and the dummy gate electrode layer 26 are patterned to form the dummy gate structure over and across the fin structures 18 and the insulating/isolation feature 22, in accordance with some embodiments.

After the dummy gate structure is formed, two opposing gate spacers 28 are formed on opposite sidewall surfaces of the dummy gate structure including the dummy gate dielectric layer 24 and the dummy gate electrode layer 26. The gate spacers 28 may be a single layer or multiple layers. In some embodiments, the gate spacers 28 are made of silicon nitride, silicon oxide, silicon carbide, silicon oxynitride, or another applicable material. In some embodiments, the gate spacers 28 are formed by chemical vapor deposition (CVD), physical vapor deposition, (PVD), atomic layer deposition (ALD), or another applicable process.

Figure 1G:
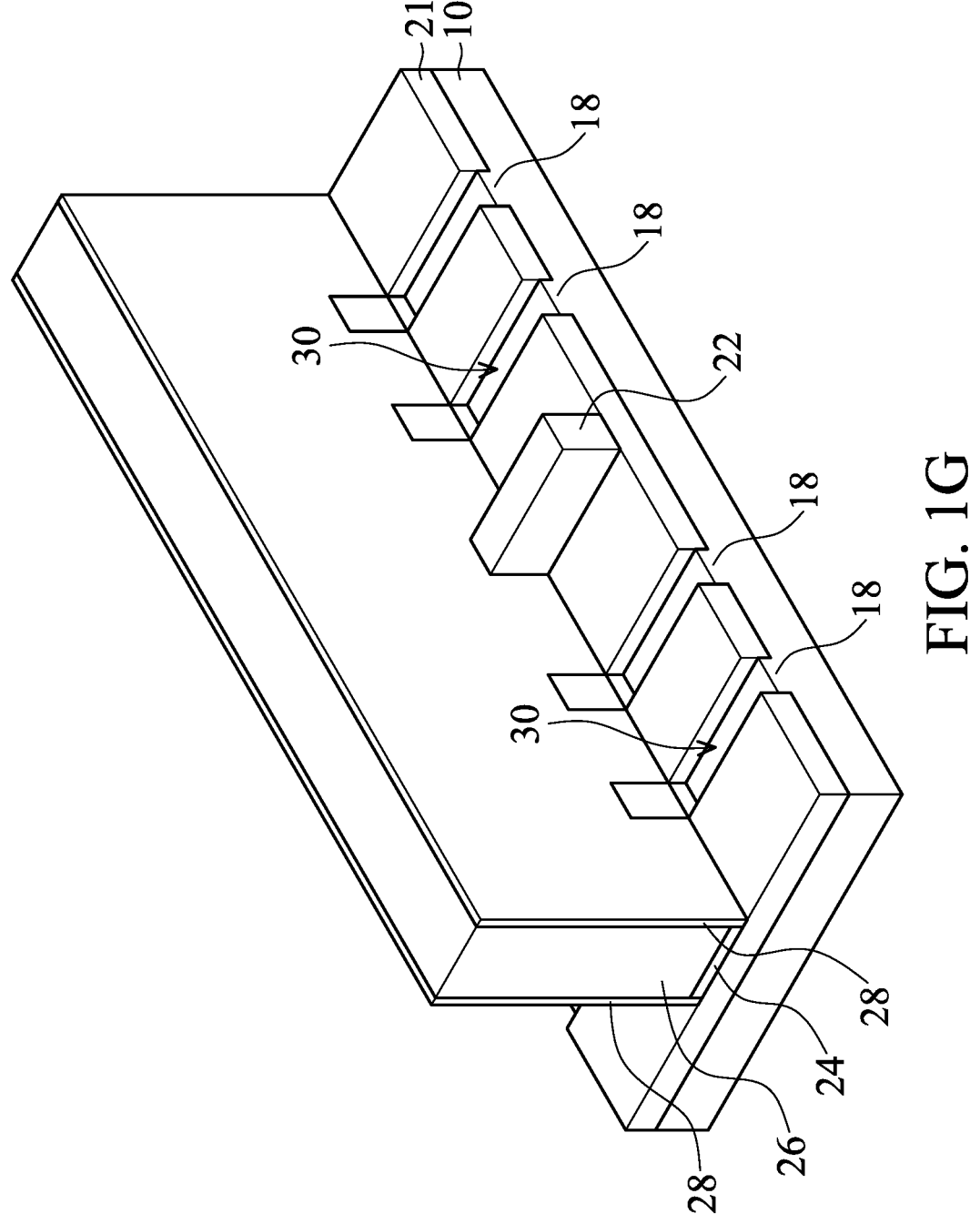

Openings 30 are formed on opposing sidewall surfaces of the dummy gate structure by a fin recess process after the formation of the gate spacers 28, as shown in FIG. 1G in accordance with some embodiments. In some embodiments, the fin recess process is a dry etching process or a wet etching process. The bottom surfaces of the formed openings 30 are lower than the top surfaces of the isolation structures 21.

Figure 1H:
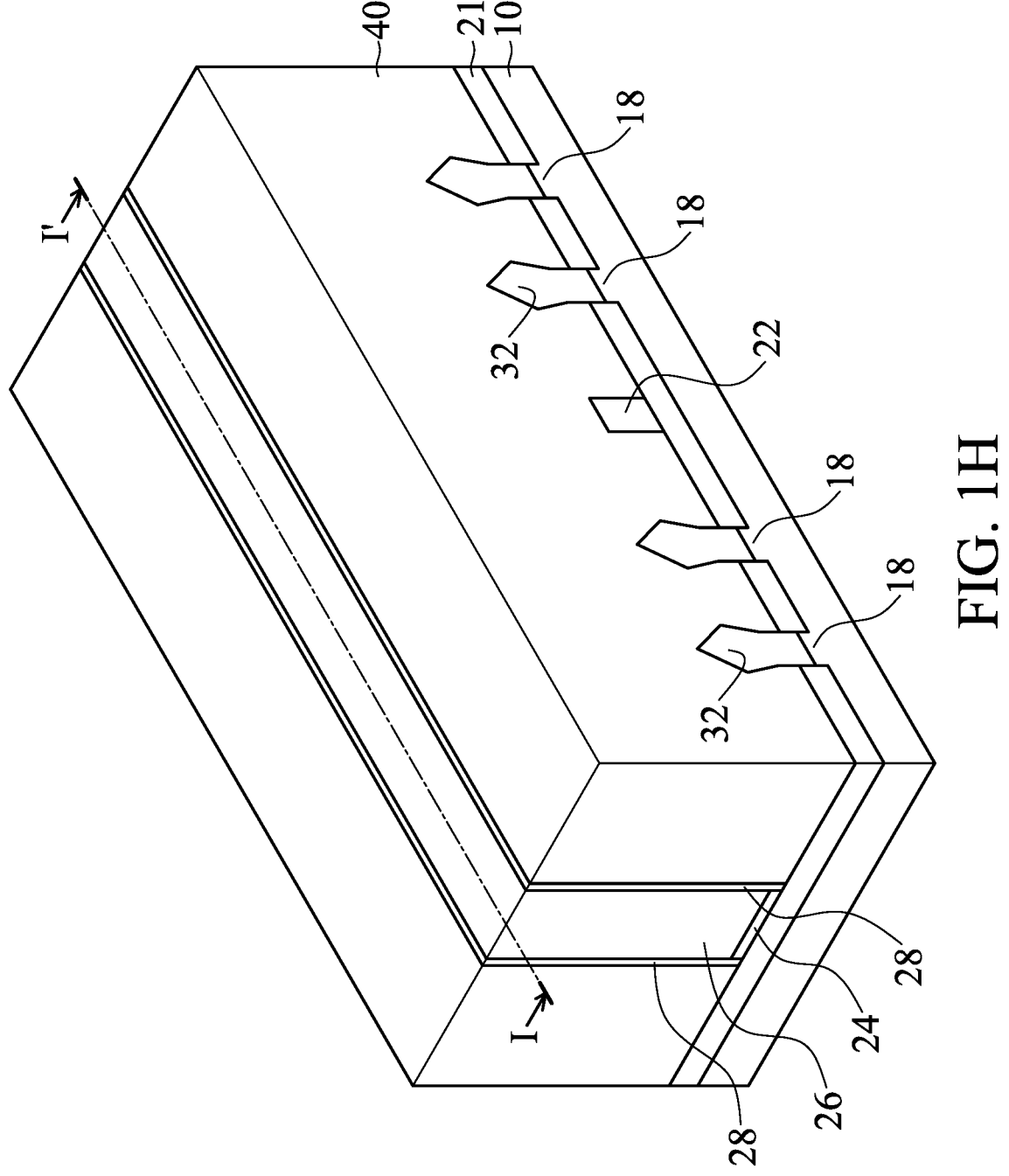

Afterwards, source/drain features 32 are formed in the openings 30 (which is indicated by FIG. 1G) of the fin structures 18 and protrude above the isolation structures 21, as shown in FIG. 1H in accordance with some embodiments. More specifically, portions of the fin structures 18 adjacent to the dummy gate structure are recessed to form openings 30. Afterwards, an epitaxial material may be grown in each opening 120 by, for example, an epitaxial growth process to form the source/drain features 32. As a result, the source/ drain features 32 are formed over the fin structures 18 and on opposing sidewall surfaces of the dummy gate structure. In some embodiments, the source/drain features 32 include Ge, SiGe, InAs, InGaAs, InSb, GaAs, GaSb, InAlP, InP, or the like.

After the source/drain features 32 are formed, an insulating layer 40 (e.g., an inter-layer dielectric (ILD) layer) is formed over the semiconductor substrate 10 to cover the dummy gate structure the source/drain features 32, in accordance with some embodiments. For example, the insulating layer 40 may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or another applicable dielectric material. Examples of low-k dielectric materials include, fluorinated silica glass (FSG), carbon doped silicon oxide, amorphous fluorinated carbon, parylene, bis-benzocyclobutenes (BCB), or polyimide. In some embodiments, the insulating layer 40 is formed by chemical vapor deposition (CVD), physical vapor deposition, (PVD), atomic layer deposition (ALD), spin-on coating, or another applicable process.

In some other embodiments, a contact etch stop layer (not shown) is formed between the semiconductor substrate 10 and the insulating layer 40. For example, the contact etch stop layer may be made of silicon nitride, silicon oxynitride, and/or another applicable material, in accordance with some embodiments. The contact etch stop layer may be formed by plasma enhanced chemical vapor deposition (PECVD), low-pressure chemical vapor deposition (LPCVD), atomic layer deposition (ALD), or another applicable process.

Afterwards, a planarization process is performed on the insulating layer 40 until the top surface of the dummy gate structure is exposed, as shown in FIG. 1H in accordance with some embodiments. In some embodiments, the insulating layer 40 is planarized by a polishing process, such as a chemical mechanical polishing (CMP) process.

Figure 2A:
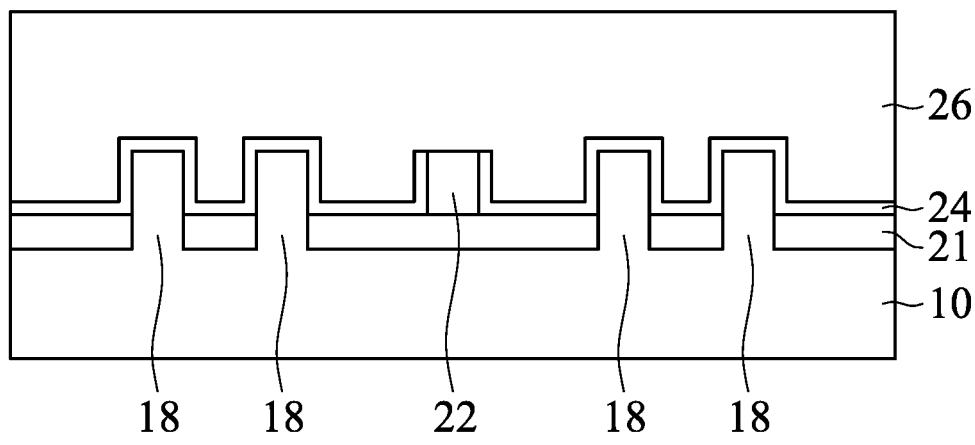

Refer to FIGS. 2A to 2I, which show cross-sectional views of various stages of forming a semiconductor device structure 1001, in accordance with some embodiments, in which FIG. 2A is a schematic cross-sectional view showing the semiconductor device structure taken along the line I-I' in FIG. 1H. A dummy structure is formed over the semiconductor substrate 10 to cover the fin structures 18 and the insulating/isolation feature 22, as shown in FIGS. 1F to 1H and 2A. More specifically, a portion of the dummy gate dielectric layer 24 that covers the top surface of the insulating/isolation feature 22 is removed prior to the formation of the dummy gate electrode layer 26, so that the formed dummy gate electrode layer 26 is in direct contact with the top surface of the insulating/isolation feature 22, as shown in FIG. 2A.

Figure 2B:
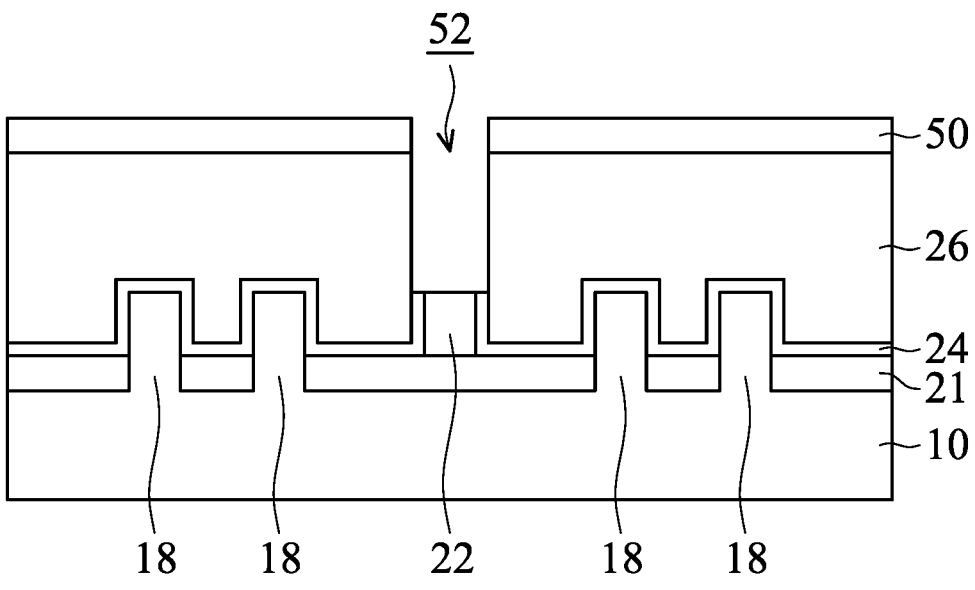

After the insulating layer 40 (which is indicated by FIG. 1H) is formed, a masking layer 50 with an opening is formed over the dummy gate structure and the insulating layer 40, as shown in FIG. 2B in accordance with some embodiments. In some embodiments, the opening of the masking layer 50 is used for patterning the underlying dummy electrode layer 26, so as to cut the dummy gate structure in subsequent processes. In some embodiments, the masking layer 50 is made of silicon nitride, silicon carbon nitride, silicon oxynitride, or another applicable material. The masking layer 50 may be formed by a deposition process, such as a chemical vapor deposition (CVD) process, a low-pressure chemical vapor deposition (LPCVD) processes, a plasma enhanced chemical vapor deposition (PECVD) process, or another applicable process. The opening in the masking layer 50 may be formed by a lithography process followed by an etching process (e.g., a dry etching process, a wet etching process, or a combination thereof), in accordance with some embodiments. For example, the formed opening may be formed directly above the insulating/isolation feature 22 by a dry etching process after performing the lithography process.

Afterwards, in some embodiments, a cut opening 52 is formed to cut the dummy gate structure. More specifically, the cut opening 52 is formed by etching the dummy gate structure using the masking layer 50 as an etch mask, so that the top surface of the insulating/isolation feature 22 is exposed through the cut opening 52. The cut opening 52 including sidewalls divides the dummy gate dielectric layer 24 and the overlying dummy gate electrode layer 26 into two portions. Since the cut opening 52 is formed in the dummy gate structure, the cut opening 52, as well as the gate spacers 28, the fin structures 18, and the insulating/isolation feature 22, are formed in the insulating layer 40.

Figure 2C:
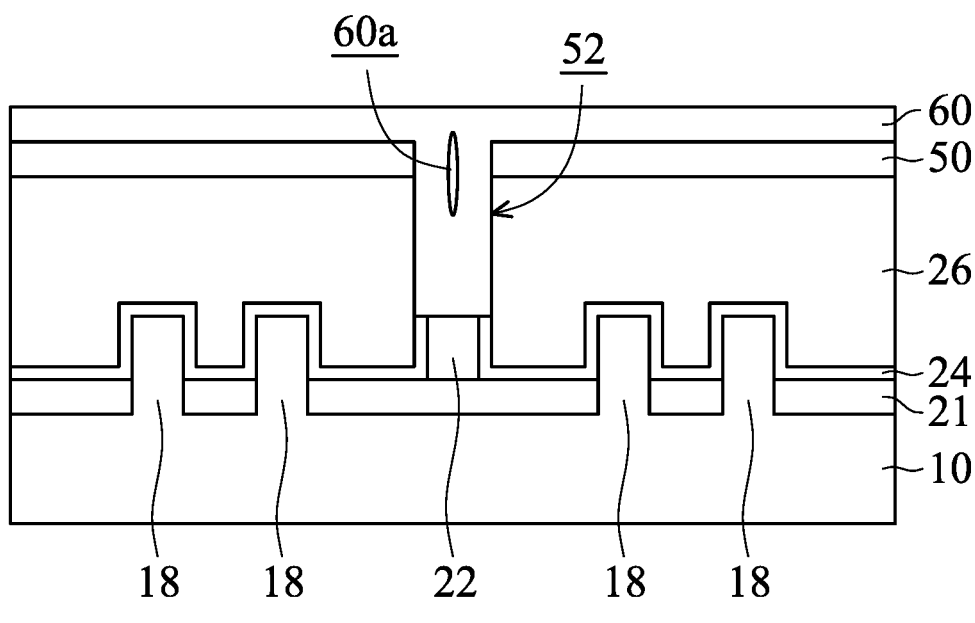

After the cut opening 52 is formed, the cut opening 52 is filled with a multilayer insulating structure to form a gate isolation structure, as shown in FIGS. 2C-2F in accordance with some embodiments. In some embodiments, an insulating material layer 60 is formed over the masking layer 50 and fully fills the cut opening 52, as shown in FIG. 2C. More specifically, after the insulating material layer 60 fills the cut opening 52, a seam 60a may be formed in the insulating material layer 60 near the upper portion of the cut opening 52 due to the high aspect ratio of the cut opening 52. Therefore, the seam 60a is also referred to as high-aspect-ratio-induced seam. In some embodiments, the insulating material layer 60 is made of a low-k material. For example, the low-k material may be made of porous SiO2, porous SiCO, SiO2:F(k=3.5), nitrogen-free material, or another applicable low-k material. The insulating material layer 60 may be formed by a deposition process, such as a chemical vapor deposition (CVD) process, a low-pressure chemical vapor deposition (LPCVD) processes, a plasma enhanced chemical vapor deposition (PECVD) process, or another applicable process.

Figure 2D:
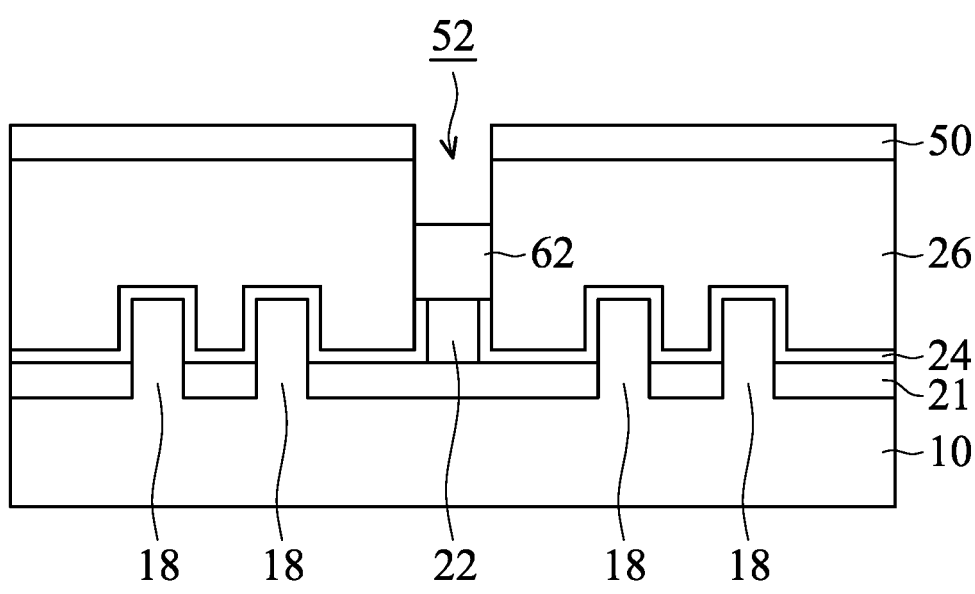

Afterwards, the insulating material layer 60 is recessed by an optional planarization process (e.g., chemical mechanical polish (CMP)) followed by an etching process (such as a dry etching process or a wet etching process), to remove portions of the insulating material layer 60 above and in the upper portion of the cut opening 52, as shown in FIG. 2D in accordance with some embodiments. As a result, the top surface of the masking layer 50 and sidewalls of the upper portion of the cut opening 52 are exposed, and a portion of the insulating material layer 60 remains in the lower portion of the cut opening 52. The remaining insulating material layer 60 forms an insulating feature 62 (which is also referred to as isolation layer) to serve as a portion of the multilayer gate isolation structure. Such a recess process removes the seam 60a in the insulating material layer 60. Further, the remaining insulating material layer 60 (i.e., insulating feature 62) reduces the aspect ratio of the cut opening 52, thereby improving the gap-fill capability of the material to be filled in the cut opening 52.

Figure 2E:
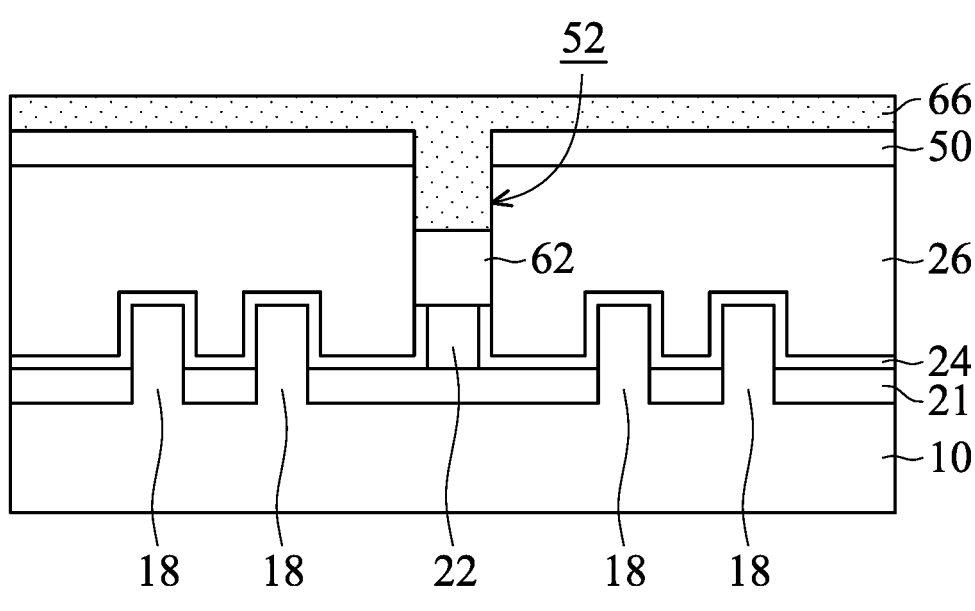
Figure 2F:
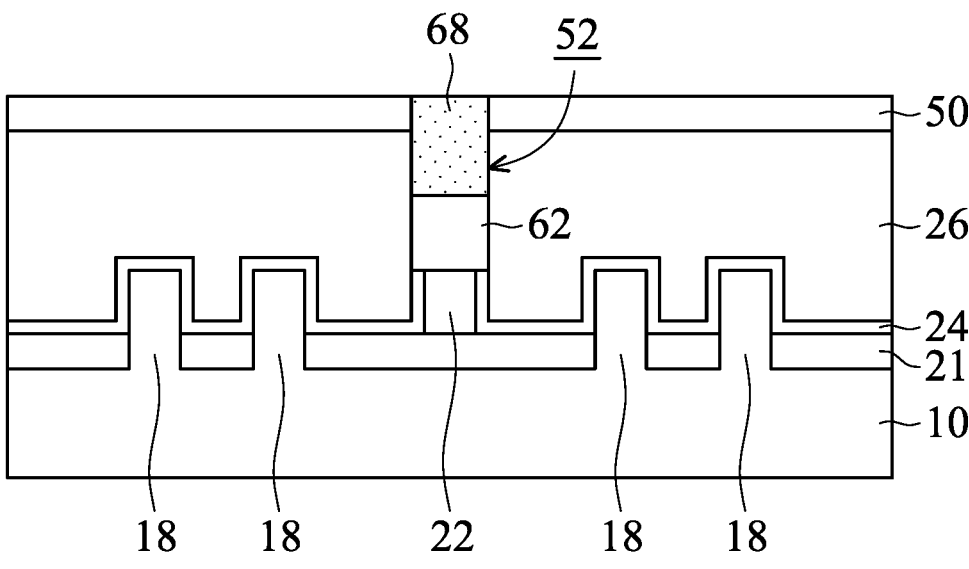

After the insulating feature 62 is formed, the cut opening 52 is filled with an insulating layer 66 for formation of the multilayer gate isolation structure, as shown in FIG. 2E in accordance with some embodiments. More specifically, the insulating material layer 66 is formed over the masking layer 50 and fully fills the upper portion of the cut opening 52. Since the aspect ratio of the cut opening 52 is reduced due to the existence of the insulating feature 62, there is no seam formed in the insulating material layer 66 near the upper portion of the cut opening 52. In some embodiments, the insulating material layer 66 is made of a material that is different than that of the insulating material layer 60. More specifically, the insulating material layer 66 has a higher dielectric constant and etching resistance than the insulating material layer 60. For example, the insulating material layer 66 may be made of SiCN, SiCN:O, BN, TaO$_2$, TaON, HfON, or HfOC, or another applicable high-k material. The insulating material layer 66 may be formed by a deposition process, such as a chemical vapor deposition (CVD) process, a low-pressure chemical vapor deposition (LPCVD) processes, a plasma enhanced chemical vapor deposition (PECVD) process, or another applicable process Afterwards, the insulating material layer 66 is recessed by a planarization process (e.g., chemical mechanical polish (CMP)) or an etching process (such as a dry etching process or a wet etching process), to remove the excess insulating material layer 66 above the masking layer 50, as shown in FIG. 2F in accordance with some embodiments. As a result, the top surface of the masking layer 50 is exposed again. Moreover, a portion of the insulating material layer 66 remains in the upper portion of the cut opening 52 and is in direct contact with the top surface of the insulating feature 62. The remaining insulating material layer 66 forms an insulating feature 68 (which is also referred to as isolation layer) to serve as a portion of the multilayer gate isolation structure. Accordingly, the stack of the insulating feature 22, the insulating feature 62 and the insulating feature 68 form a multilayer gate isolation structure 70 (as indicated in FIG. 2G) to separate the two portions of the dummy gate structure.

Figure 2G:
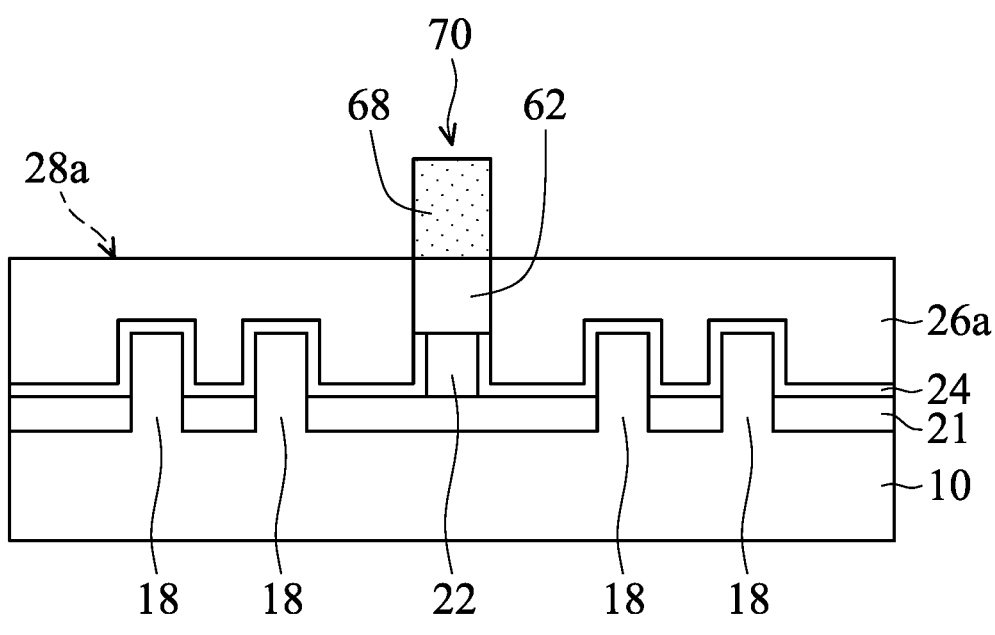

Afterwards, the masking layer 50 and a portion of the dummy gate electrode layer 26 are successively removed, as shown in FIG. 2G in accordance with some embodiments. More specifically, the masking layer 50 is entirely removed from the top surface of the dummy gate electrode layer 26. In order to smoothly and completely remove the dummy gate structure in the subsequent etching process, a portion of the exposed dummy gate electrode layer 26 is firstly removed to expose sidewalls of the insulating feature 68. In some embodiments, the remaining dummy gate electrode layer 26a has a top surface that is substantially level with the top surface of the insulating feature 62. In those cases, the entire sidewalls of the insulating feature 68 are exposed from the dummy gate electrode layer 26. For example, the removal of the masking layer 50 and the dummy gate electrode layer 26 may be performed by an etching process, such as a dry etching process or a wet etching process. Afterwards, the gate spacers 28 (not shown in FIG. 2G and indicated by FIG. 1H) on opposite sides of the dummy gate structure and above the remaining dummy gate electrode layer 26a are removed. The remaining gate spacers 28a has a top surface that is also substantially level with the top surface of the insulating feature 62. The removal of gate spacers 28 may be performed by an etching process (such as a dry or wet etching process) which is also referred to as spacer pull-back etching process. After the spacer pull-back etching process, the space formed by partially removing the dummy gate electrode layer 26 may be expanded, so as to facilitate the removal of the remaining dummy gate electrode layer 26a and the underlying dummy gate dielectric layer 24 in the subsequent processes. In the multilayer gate isolation structure 70, the insulating feature 68 provides higher etching resistance than the gate spacers 28 during the spacer pull-back etching process. Therefore, the risk of breakage/peeling of the gate isolation may be reduced, thereby increasing the reliability of the multilayer gate isolation structure 70 and preventing a leakage path formed in the multilayer gate isolation structure 70.

Figure 2H:
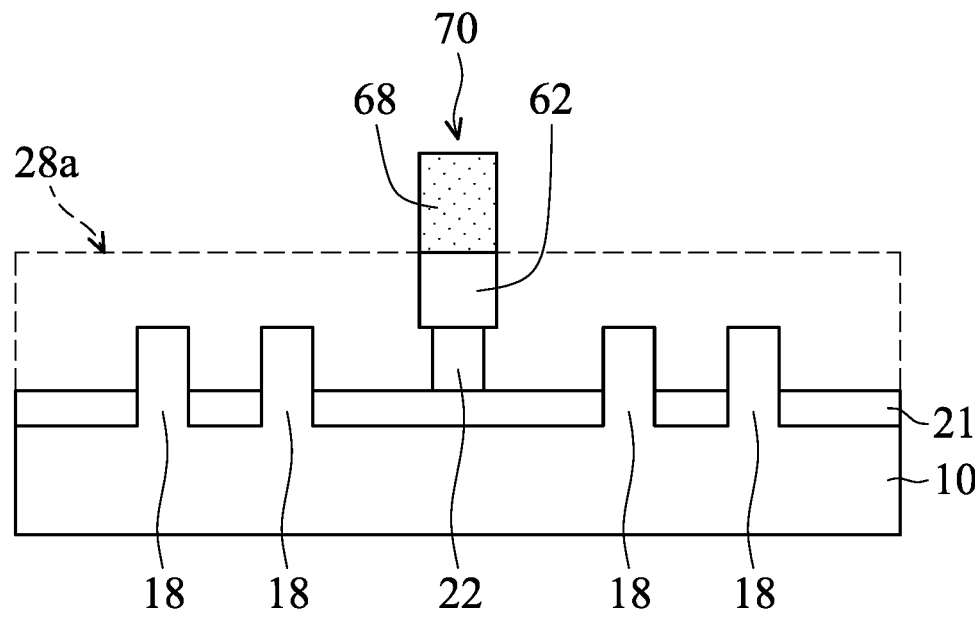
Figure 2I:
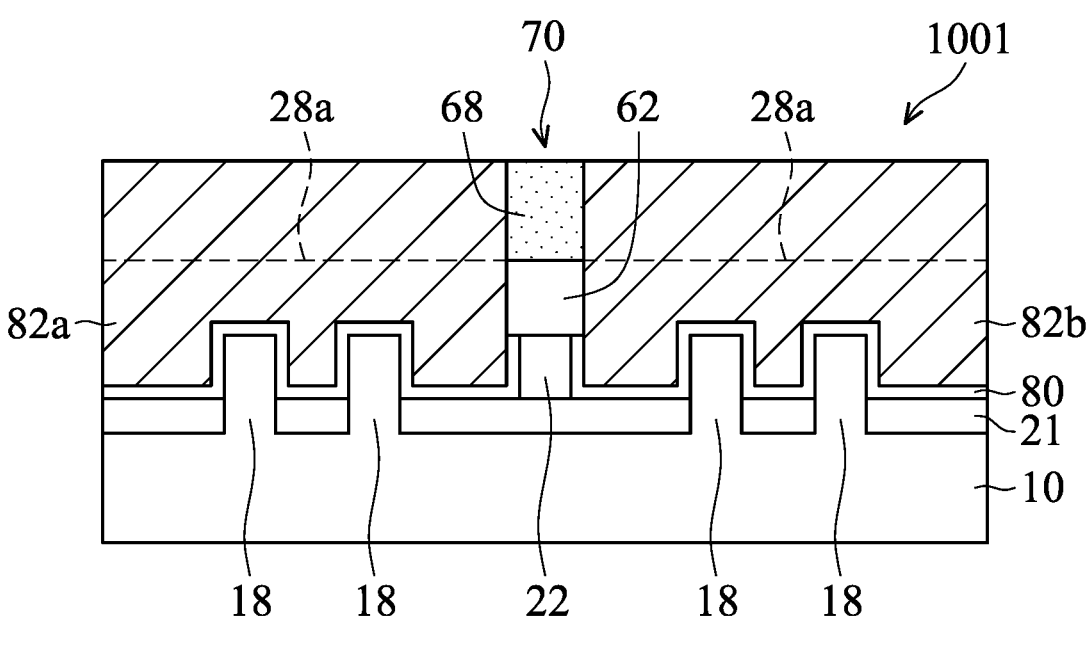

Afterwards, the dummy gate structure including the dummy gate dielectric layer 24 and two portions of the dummy gate electrode layer 26a are replaced by an active gate structure, as shown in FIGS. 2H to 2I in accordance with some embodiments. As shown in FIG. 2H, the dummy gate structure is removed to form openings (which are also referred to as gate openings) in the insulating layer 40 (not shown and indicated in FIG. 1H). More specifically, in some embodiments, the dummy gate dielectric layer 24 and the two portions of the dummy gate electrode layer 26a are removed by an etching process, such as a dry etching process or a wet etching process to expose the top surface of the isolation structure 21 and the fin structures 18 between the remaining gate spacers 28a (indicated by dashed line). As a result, the gate openings are separated by the multilayer gate isolation structure 70 including the stack of the insulating feature 22, the insulating feature 62 and the insulating feature 68.

After the dummy structure is removed, active gate structures (which are sometimes referred to as metal gate structures) are formed to replace the dummy structure, as shown in FIG. 2I in accordance with some embodiments. More specifically, the active gate structures are respectively formed in the gate openings. Each of the active gate structures across the fin structures 18. In some embodiments, the active gate structure in the gate opening has a lower portion (or a lower sidewall surface) adjacent to or in direct contact with the sidewall of the insulating feature 22 extending above the isolation structure 21, and an upper portion (or an upper sidewall surface) adjacent to or in direct contact with the sidewall of the insulating feature 68. The insulating feature 62 separating the insulating feature 22 from the insulating feature 68 is also adjacent to or in direct contact with lower portion of the active gate structure.

In some embodiments, the active gate structure in the corresponding gate opening at least includes a gate dielectric layer 80 and a gate electrode layer 82a or 82b over the gate dielectric layer 80. More specifically, the gate dielectric layer 80 is formed over the exposed fin structures 18, the exposed isolation structures 21 in the gate opening, and an exposed sidewall of the insulating/isolation feature 22 in the gate opening.

In some embodiments, the gate dielectric layer 80 is made of a high k dielectric material, such as metal oxide. Examples of the high-k dielectric material may include hafnium oxide (HfO$_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material. In some embodiments, the gate dielectric layer 80 may be formed by chemical vapor deposition (CVD), physical vapor deposition, (PVD), atomic layer deposition (ALD), or another applicable process.

An interfacial layer (not shown) may be formed between the exposed portions of the fin structures 18 and the corresponding gate dielectric layer 80, so that the adhesion of the gate dielectric layer 80 can be improved. In some embodiments, the interfacial layer is made of SiO$_2$. In some embodiments, the interfacial layer is formed by an atomic layer deposition (ALD) process, a thermal oxidation process, chemical vapor deposition (CVD) process, or another applicable process.

After the gate dielectric layer 80 is formed, a work functional metal layer (not shown) is formed over and conformally covers the inner surface of the gate opening, in accordance with some embodiments. The work function metal layer is tuned to have a proper work function. In some embodiments, the work function metal layer is made of an N-type work-function metal or a P-type work-function metal. N-type work-function metals include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. The P-type work-function metal includes titanium nitride (TiN), tungsten nitride (WN), tantalum nitride (TaN), or a combination thereof. In some embodiments, the work function metal layer is formed by atomic layer deposition (ALD), sputtering, physical vapor deposition (PVD), or another applicable process.

After the work functional metal layer is formed, the gate electrode layer 82a or 82b is formed in the gate opening to cover the work functional metal layer therein, in accordance with some embodiments. For example, the gate electrode layer 82a or 82b may be made of a metal material, such as tungsten (W). The gate electrode layer 82a or 82b may be formed by depositing the metal material using, for example, chemical vapor deposition (CVD), high density plasma CVD (HDPCVD), metal organic CVD (MOCVD), plasma enhanced CVD (PECVD), or another applicable process. Afterwards, the metal material are recessed by a planarization process (e.g., chemical mechanical polish (CMP)) or an etching process (such as a dry etching process or a wet etching process), so as to form the gate electrode layer 82a or 82b as shown in FIG. 2I in accordance with some embodiments. After the planarization or etching, the top surface of the gate electrode layers 82a and 82b are substantially level with or lower than the insulating feature 68 in the multilayer gate isolation structure 70.

Although FIGS. 2A to 2I illustrate the formation of a semiconductor device structure 1001 with the multilayer gate isolation structure 70, embodiments of the disclosure are not limited thereto. Many variations and/or modifications can be made to embodiments of the disclosure.

Figure 3A:
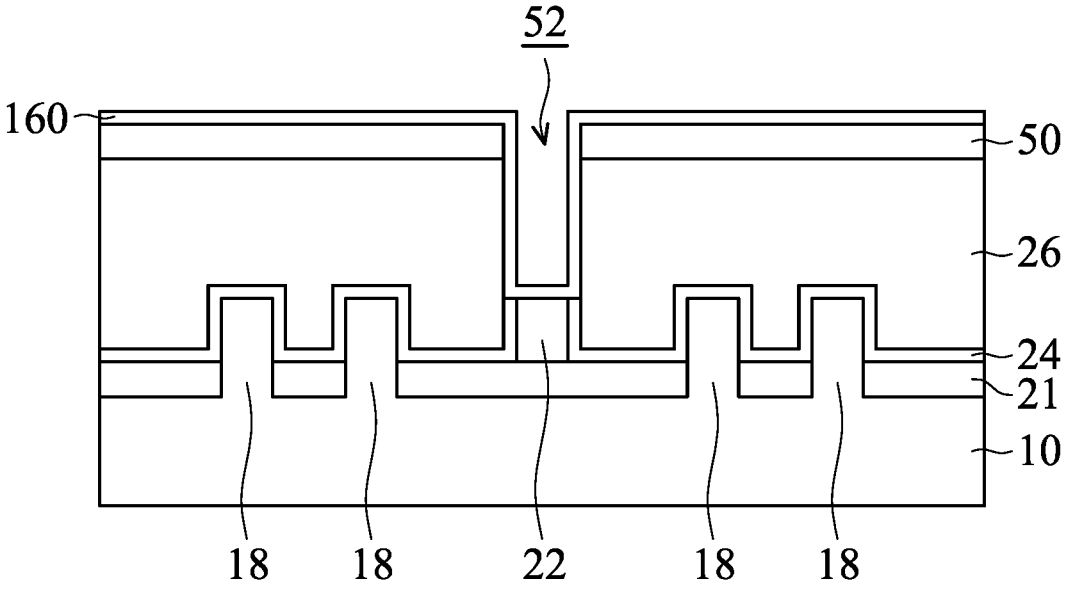
FIGS. 3A to 3E show cross-sectional views of various stages of forming a semiconductor device structure with a multilayer gate isolation structure separating FinFET transistor structures, in accordance with some embodiments.

FIGS. 3A to 3E are cross-sectional views of various stages of forming a semiconductor device structure 1002 in accordance with some embodiments. Elements in FIGS. 3A to 3E that are the same as or similar to those in FIGS. 1A to 1H and 2A to 2I are labeled with the same reference numbers as in FIGS. 1A to 1H and 2A to 2I and may be not described again for brevity. A structure similar to the structure shown in FIG. 2C is provided or formed in accordance with some embodiments. Unlike to the structure shown in FIG. 2C, there is not a low-k material layer (e.g., the insulating material layer 60) formed in the cut opening 52. More specifically, after the cut opening 52 is formed to expose the top surface of the insulating feature 22, an insulating liner layer 160 is conformally formed over the masking layer 50 and conformally covers the bottom and sidewalls of the cut opening 52, as shown in FIG. 3A in accordance with some embodiments. In some embodiments, the insulating liner layer 160 is made of a material that is the same as or similar to that of the gate spacer 28 (as indicated in FIG. 1H). Therefore, the insulating liner layer 160 may serve as a sacrificial layer or a protective layer during the subsequent spacer pull-back etching process. For example, the insulating liner layer 160 is made of silicon nitride, silicon oxide, silicon carbide, silicon oxynitride, or another applicable material. The insulating liner layer 160 may be formed by chemical vapor deposition (CVD), physical vapor deposition, (PVD), atomic layer deposition (ALD), or another applicable process.

Figures 3B, 3C:
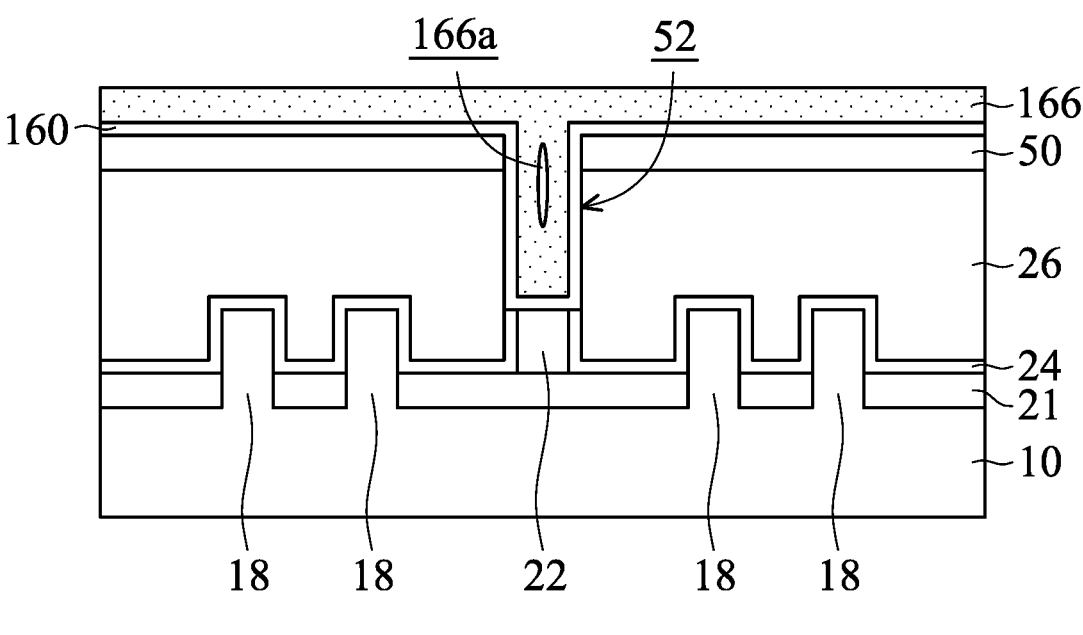

Afterwards, an insulating material layer 166 is formed above the masking layer 50 and fully fills the cut opening 52, as shown in FIG. 3B in accordance with some embodiments. More specifically, the insulating material layer 166 is formed over the insulating liner layer 160 covering the masking layer 50 and fills the cut opening 52 conformally covered by the insulating liner layer 160. After the insulating material layer 166 fills the cut opening 52, a seam 166a may be formed in the insulating material layer 166 near the upper portion of the cut opening 52 due to the high aspect ratio of the cut opening 52. Therefore, the seam 166a is also referred to as high-aspect-ratio-induced seam. In some embodiments, the material and the formation method used for the insulating material layer 166 are the same as or similar to those used for the insulating material layer 66 shown in FIG. 2D.

Afterwards, the insulating material layer 166 and the insulating liner layer 160 above the masking layer 50 are successively removed by a planarization process (e.g., chemical mechanical polish (CMP)) or an etching process (such as a dry etching process or a wet etching process), as shown in FIG. 3C in accordance with some embodiments. As a result, the top surface of the masking layer 50 is exposed. Moreover, a portion of the insulating material layer 166 with the seam 166a and a portion of the insulating liner layer 160 remain in the cut opening 52. The remaining insulating material layer 166 forms an insulating feature 168 (which is also referred to as isolation layer) to serve as a portion of the multilayer gate isolation structure. Further, the remaining insulating liner layer 160 surrounds the bottom and the sidewalls of the insulating feature 168 and forms an insulating feature 162 (which is also referred to as isolation layer or isolation liner) to serve as a portion of the multilayer gate isolation structure. Accordingly, the stack of the insulating feature 22, the insulating feature 162 and the insulating feature 168 form a multilayer gate isolation structure 170 (as indicated in FIG. 3D) to separate the two portions of the dummy gate structure.

Figure 3D:
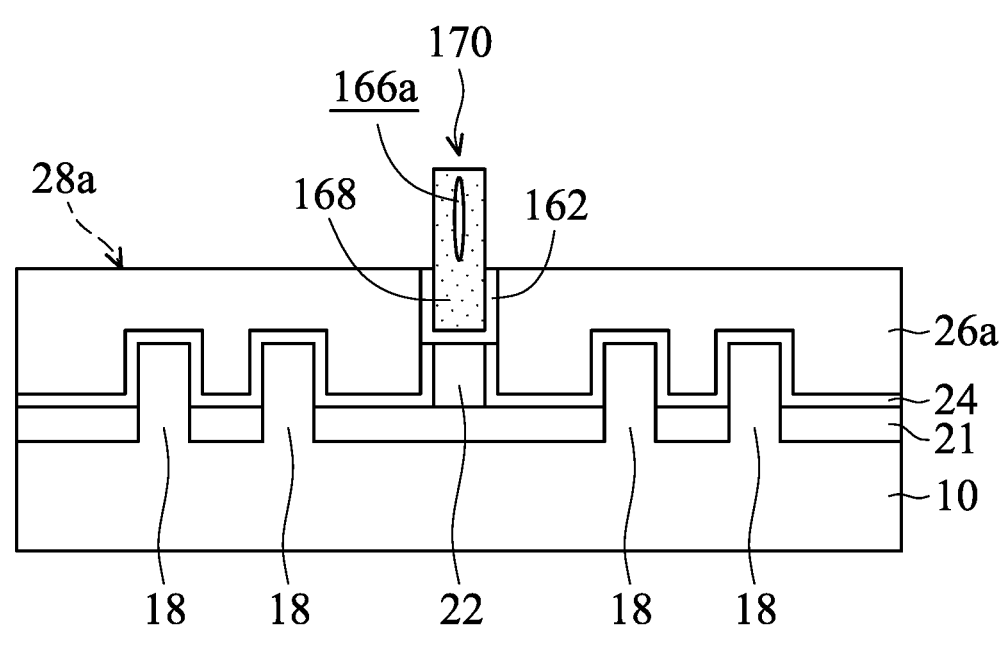

Afterwards, in some embodiments, the masking layer 50 and a portion of the dummy gate electrode layer 26 are successively removed, as shown in FIG. 3D. In some embodiments, the method used for the removal of the masking layer 50 and a portion of the dummy gate electrode layer 26 is the same as the method shown in FIG. 2G. Afterwards, the gate spacers 28 (not shown in FIG. 3D and indicated by FIG. 1H) on opposite sides of the dummy gate structure and above the remaining dummy gate electrode layer 26a are removed by performing the spacer pull-back etching process. In the multilayer gate isolation structure 170, a portion of the insulating feature 162 that protrudes above the remaining dummy gate electrode layer 26a may be removed during the spacer pull-back etching process. Therefore, the removed portion of the insulating feature 162 serves as a sacrificial layer to protect the multilayer gate isolation structure 170 from breakage or necking during the spacer pull-back etching process. The top of the remaining portion of the insulating feature 162 is lower than the top of the seam 166a

Further, although the seam 166a is formed in the insulating feature 168, the insulating feature 168 can provide higher etching resistance than the gate spacers 28 to avoid the seam 166a from being exposed during the spacer pull-back etching process. Therefore, the risk of breakage/peeling of the gate isolation may be reduced further, thereby increasing the reliability of the multilayer gate isolation structure 170 and preventing a leakage path formed in the multilayer gate isolation structure 170. In addition, the seam 166*a* may serve as an air gap in the multilayer gate isolation structure 170 to reduce the dielectric constant of the multilayer gate isolation structure 170, thereby reducing the parasitic capacitance between the subsequently formed gate electrode layers on both sides (or opposite sides) of the multilayer gate isolation structure 170.

Figure 3E:
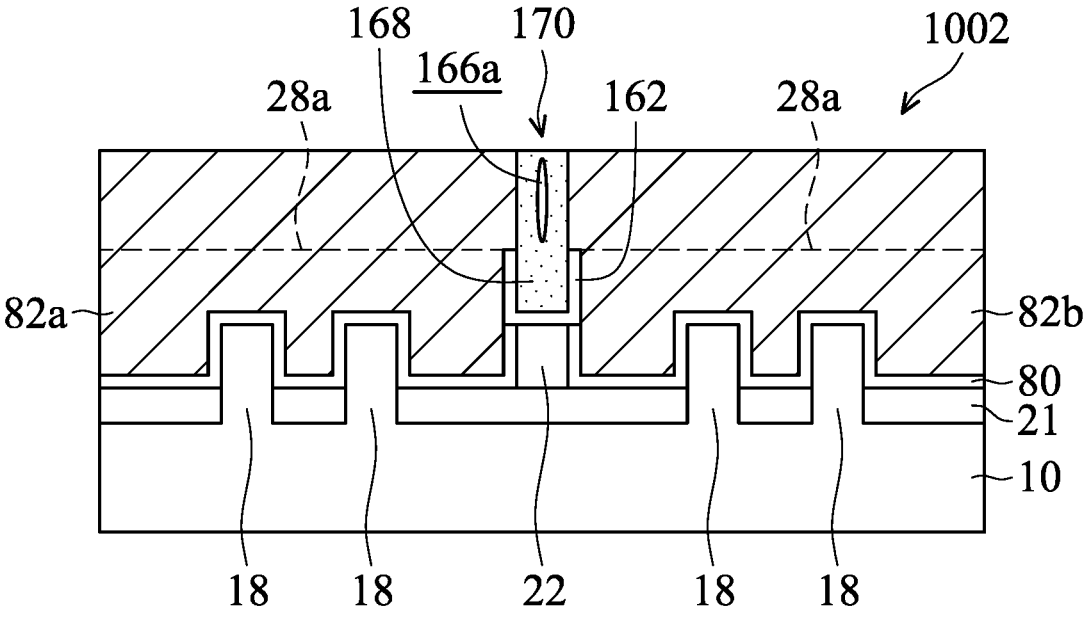

Afterwards, the dummy gate structure including the dummy gate dielectric layer 24 and two portions of the dummy gate electrode layer 26*a* are replaced by an active gate structure as shown in FIG. 3E in accordance with some embodiments. For example, the method used for replacing the dummy gate structure with the active gate structure may be the same as the method shown in FIGS. 2H to 2I.

Although FIGS. 2A to 2I illustrate the formation of a semiconductor device structure 1001 with the multilayer gate isolation structure 70 and FIGS. 3A to 3E illustrate the formation of a semiconductor device structure 1002 with the multilayer gate isolation structure 170, embodiments of the disclosure are not limited thereto. Many variations and/or modifications can be made to embodiments of the disclosure.

Figure 4A:
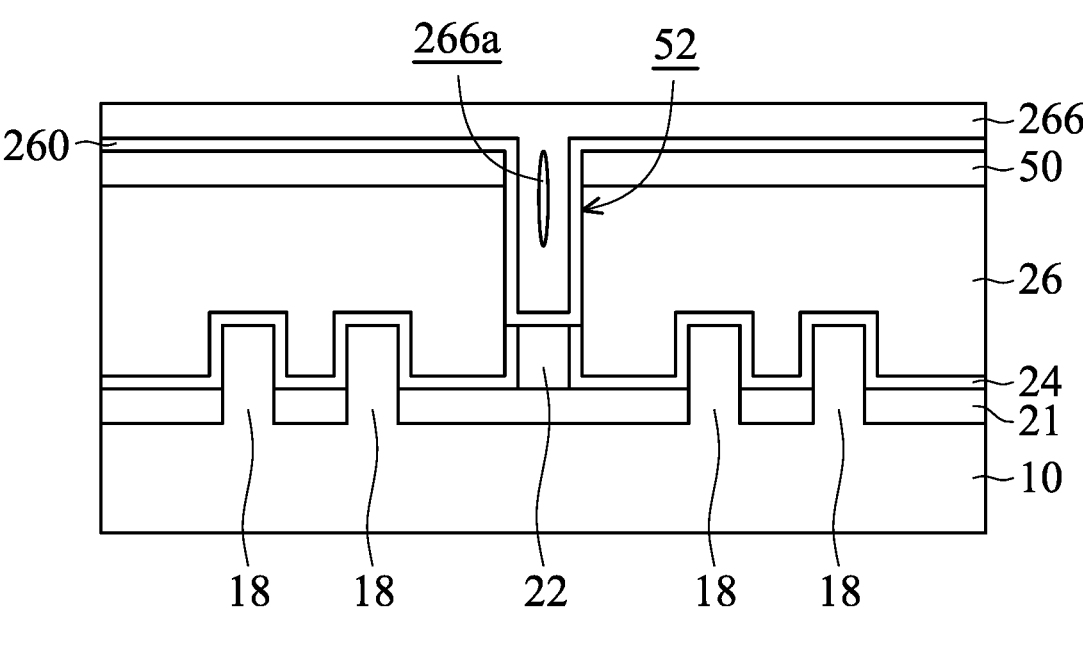
FIGS. 4A to 4F show cross-sectional views of various stages of forming a semiconductor device structure with a multilayer gate isolation structure separating FinFET transistor structures, in accordance with some embodiments.

FIGS. 4A to 4F are cross-sectional views of various stages of forming a semiconductor device structure 1003 in accordance with some embodiments. Elements in FIGS. 4A to 4F that are the same as or similar to those in FIGS. 1A to 1H, 2A to 2I and 3A to 3E are labeled with the same reference numbers as in FIGS. 1A to 1H, 2A to 2I and 3A to 3E and may be not described again for brevity. A structure similar to the structure shown in FIG. 3B is provided or formed in accordance with some embodiments. Unlike to the structure shown in FIG. 3B, an insulating material layer 266 is formed above the masking layer 50 and fully fills the cut opening 52 instead of the insulating material layer 166, as shown in FIG. 4A in accordance with some embodiments. More specifically, the insulating material layer 266 is formed over the insulating liner layer 260 covering the masking layer 50 and fills the cut opening 52 conformally covered by the insulating liner layer 260. After the insulating material layer 266 fills the cut opening 52, a seam 266*a* may be formed in the insulating material layer 266 near the upper portion of the cut opening 52 due to the high aspect ratio of the cut opening 52. Therefore, the seam 266*a* is also referred to as high-aspect-ratio-induced seam. In some embodiments, the material and the formation method used for the insulating material layer 266 are the same as or similar to those used for the insulating material layer 60 shown in FIG. 2C. Moreover, the material and the formation method used for the insulating liner layer 260 are the same as or similar to those used for the insulating liner layer 160 shown in FIG. 3A.

Figure 4B:
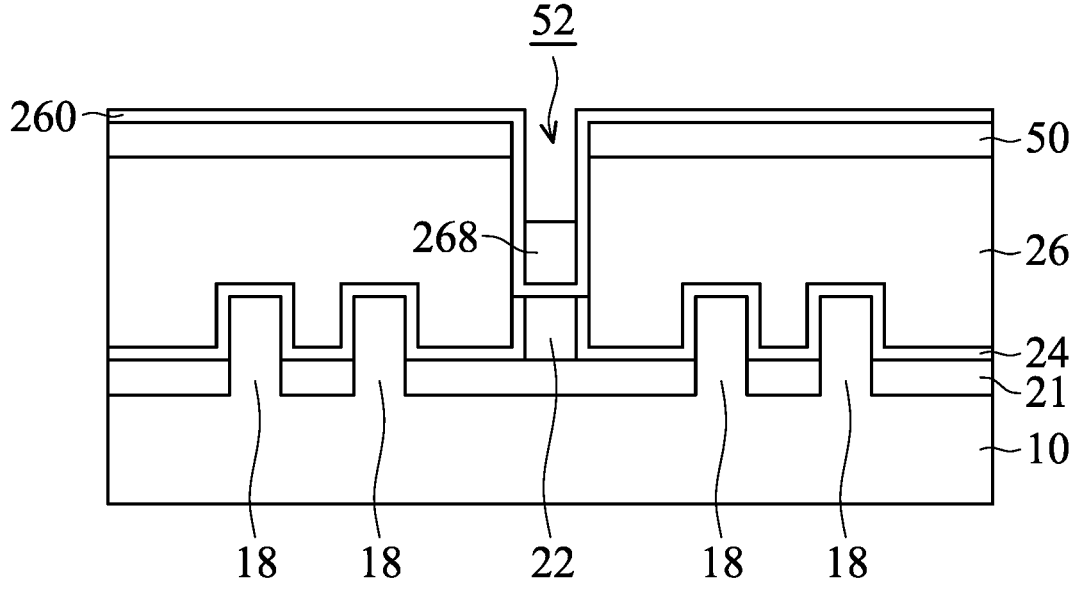

Afterwards, the insulating material layer 266 is recessed by a method that is the same as or similar to the method used for recessing the insulating material layer 60 (which is shown in FIGS. 2C to 2D), as shown in FIG. 4B in accordance with some embodiments. As a result, the insulating liner layer 160 on the masking layer 50 and on the sidewalls of the upper portion of the cut opening 52 is exposed. Further, a portion of the insulating material layer 266 remains in the lower portion of the cut opening 52. The remaining insulating material layer 266 forms an insulating feature 268 (which is also referred to as isolation layer) to serve as a portion of the multilayer gate isolation structure.

Figure 4C:
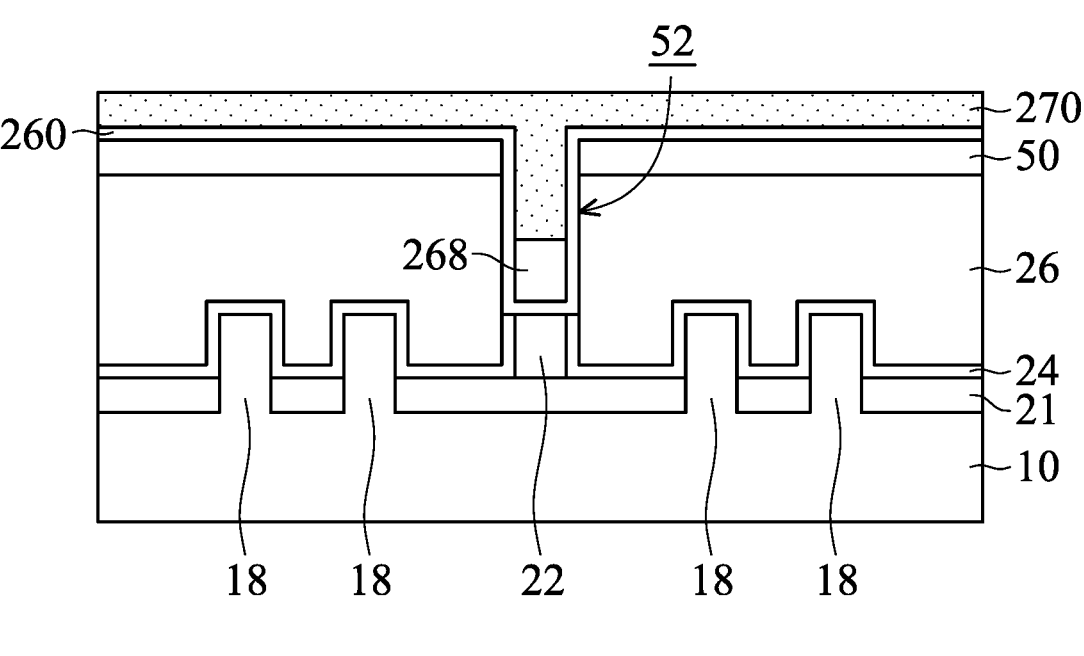

After the insulating feature 268 is formed, the cut opening 52 is filled with an insulating layer 270 for formation of the multilayer gate isolation structure, as shown in FIG. 4C in accordance with some embodiments. More specifically, the insulating material layer 270 is formed over the insulating liner layer 260 to cover the masking layer 50 and fully fills the upper portion of the cut opening 52. Since the aspect ratio of the cut opening 52 is reduced due to the existence of the insulating feature 268, there is no seam formed in the insulating material layer 270 near the upper portion of the cut opening 52. In some embodiments, the material and the formation method used for the insulating material layer 270 are the same as or similar to those used for the insulating material layer 66 shown in FIG. 2E.

Figure 4D:
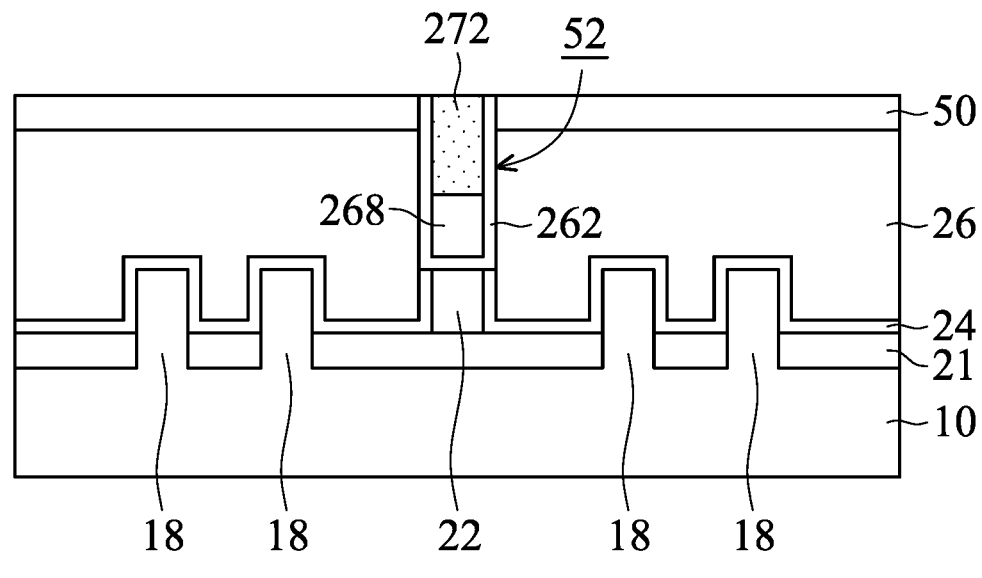

Afterwards, the insulating material layer 270 and the insulating liner layer 260 above the masking layer 50 are successively removed by a planarization process (e.g., chemical mechanical polish (CMP)) or an etching process (such as a dry etching process or a wet etching process), as shown in FIG. 4D in accordance with some embodiments. As a result, the top surface of the masking layer 50 is exposed. Moreover, a portion of the insulating material layer 270 and a portion of the insulating liner layer 260 remain in the cut opening 52. The remaining insulating material layer 270 forms an insulating feature 272 (which is also referred to as isolation layer) to serve as a portion of the multilayer gate isolation structure. Further, the remaining insulating liner layer 260 forms an insulating feature 262 (which is also referred to as isolation layer or isolation liner). Furthermore, the insulating feature 268 surrounded by or within the insulating feature 262 serve as a portion of the multilayer gate isolation structure. Accordingly, the stack of the insulating feature 22, the insulating feature 262, the insulating feature 268 and the insulating feature 272 form a multilayer gate isolation structure 274 (as indicated in FIG. 4E) to separate the two portions of the dummy gate structure.

Figure 4E:
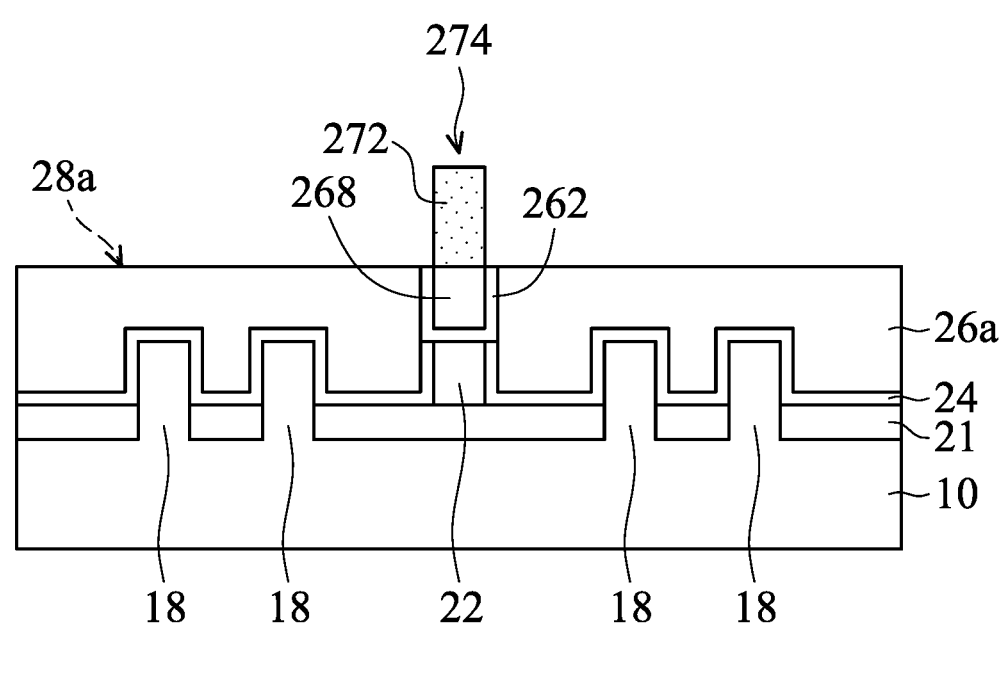

Afterwards, in some embodiments, the masking layer 50 and a portion of the dummy gate electrode layer 26 are successively removed, as shown in FIG. 4E. In some embodiments, the method used for the removal of the masking layer 50 and a portion of the dummy gate electrode layer 26 is the same as the method shown in FIG. 2G. Afterwards, the gate spacers 28 (not shown in FIG. 4E and indicated by FIG. 1H) on opposite sides of the dummy gate structure and above the remaining dummy gate electrode layer 26*a* are removed by performing the spacer pull-back etching process. In the multilayer gate isolation structure 274, a portion of the insulating feature 262 that protrudes above the remaining dummy gate electrode layer 26*a* may be removed during the spacer pull-back etching process. Similar to the insulating feature 162 shown in FIGS. 3C to 3D, the removed portion of the insulating feature 262 serves as a sacrificial layer to protect the multilayer gate isolation structure 274 during the spacer pull-back etching process.

Figure 4F:
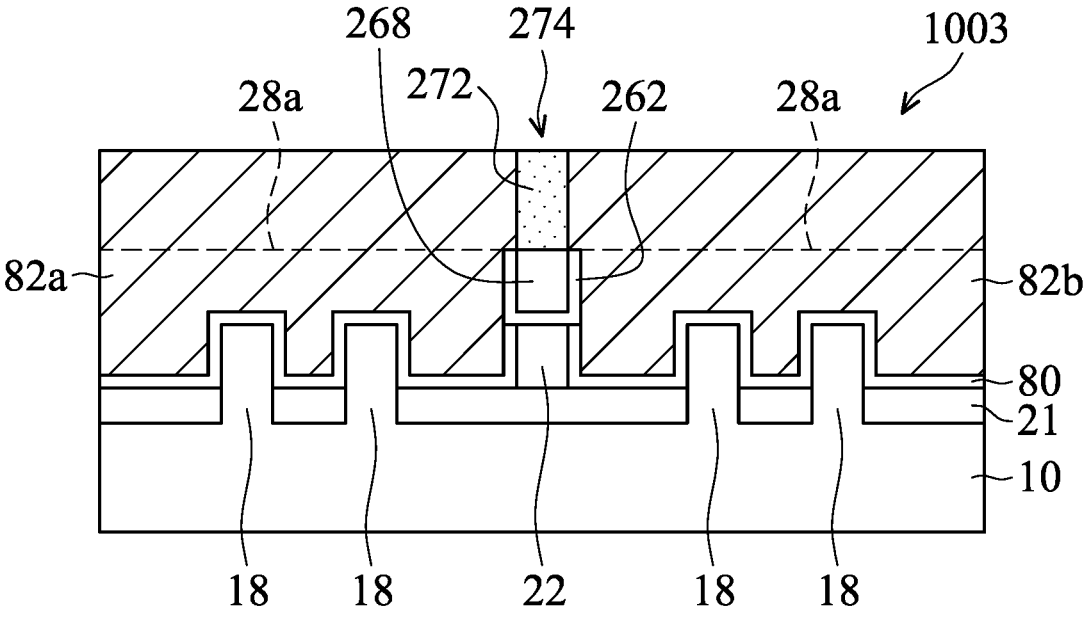

Afterwards, the dummy gate structure including the dummy gate dielectric layer 24 and two portions of the dummy gate electrode layer 26*a* are replaced by an active gate structure as shown in FIG. 4F in accordance with some embodiments. For example, the method used for replacing the dummy gate structure with the active gate structure may be the same as the method shown in FIGS. 2H to 2I.

Although FIGS. 2A to 2I illustrate the formation of a semiconductor device structure 1001 with the multilayer gate isolation structure 70 and FIGS. 4A to 4F illustrate the formation of a semiconductor device structure 1003 with the multilayer gate isolation structure 274, embodiments of the disclosure are not limited thereto. Many variations and/or modifications can be made to embodiments of the disclosure.

FIGS. 5A to 5F are cross-sectional views of various stages of forming a semiconductor device structure 1004 in accordance with some embodiments. Elements in FIGS. 5A to 5F that are the same as or similar to those in FIGS. 1A to 1H, 2A to 2I and 4A to 4F are labeled with the same reference numbers as in FIGS. 1A to 1H, 2A to 2I and 4A to 4F and may be not described again for brevity. A structure similar to the structure shown in FIG. 4A is provided or formed in accordance with some embodiments. Similar to the arrangement of the insulating liner layer 260 and the insulating material layer 266 in the structure shown in FIG. 4A, an insulating liner layer 360 and an insulating material layer 366 are successively formed over the masking layer 50 and fill the cut opening 52 in accordance with some embodiments. More specifically, the insulating material layer 266 is formed over the insulating liner layer 360 covering the masking layer 50 and fills the cut opening 52 conformally covered by the insulating liner layer 360. After the insulating material layer 366 fills the cut opening 52, a seam 366a may be formed in the insulating material layer 366 near the upper portion of the cut opening 52 due to the high aspect ratio of the cut opening 52. Therefore, the seam 366a is also referred to as high-aspect-ratio-induced seam. In some embodiments, the material and the formation method used for the insulating material layer 366 are the same as or similar to those used for the insulating material layer 60 shown in FIG. 2C. Moreover, the formation method used for the insulating liner layer 360 is the same as or similar to that used for the insulating liner layer 260 shown in FIG. 4A. However, unlike to the insulating liner layer 260 shown in FIG. 4A, the insulating liner layer 360 is made of a material that is the same as or similar to that of the insulating material layer 66 shown in FIG. 2E or that of the insulating material layer 270 shown in FIG. 4C.

Figure 5A:
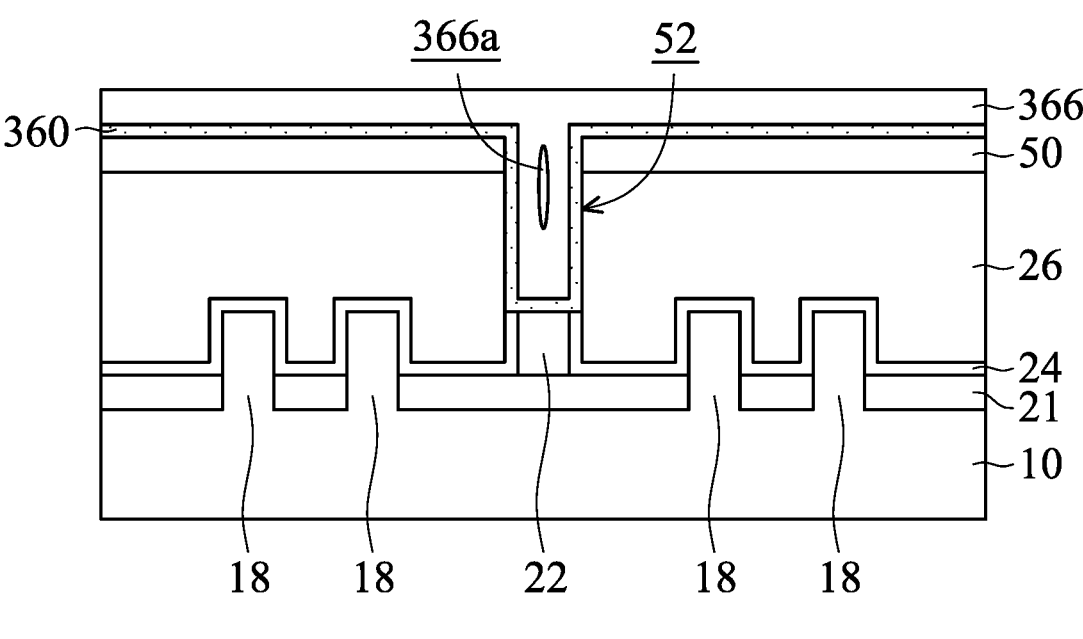
FIGS. 5A to 5F show cross-sectional views of various stages of forming a semiconductor device structure with a multilayer gate isolation structure separating FinFET transistor structures, in accordance with some embodiments.
Figure 5B:
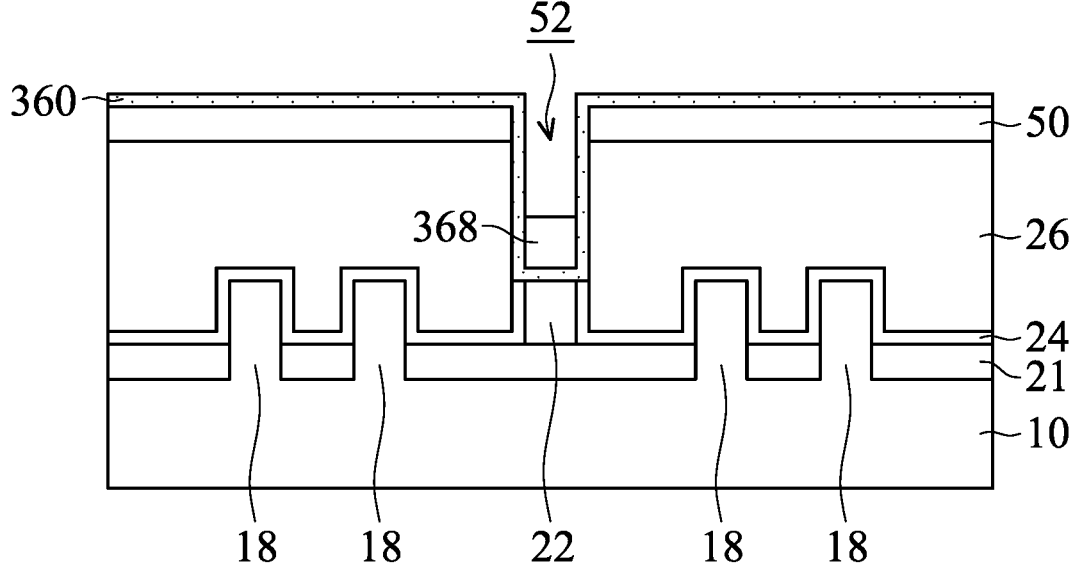

Afterwards, the insulating material layer 366 is recessed by a method that is the same as or similar to the method used for recessing the insulating material layer 60 (which is shown in FIGS. 2C to 2D), as shown in FIG. 5B in accordance with some embodiments. As a result, the insulating liner layer 360 on the masking layer 50 and on the sidewalls of the upper portion of the cut opening 52 is exposed. Further, a portion of the insulating material layer 366 remains in the lower portion of the cut opening 52. The remaining insulating material layer 366 forms an insulating feature 368 (which is also referred to as isolation layer) to serve as a portion of the multilayer gate isolation structure.

Figure 5C:
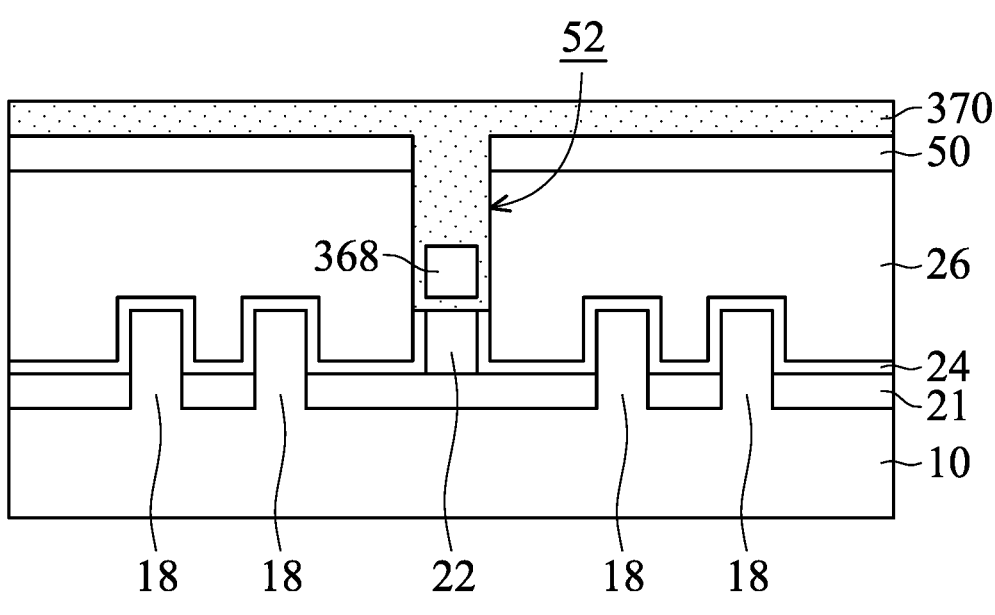

After the insulating feature 368 is formed, the cut opening 52 is filled with an insulating layer 370 for formation of the multilayer gate isolation structure, as shown in FIG. 5C in accordance with some embodiments. More specifically, the insulating material layer 370 is formed over the insulating liner layer 360 to cover the masking layer 50 and fully fills the upper portion of the cut opening 52. Since the aspect ratio of the cut opening 52 is reduced due to the existence of the insulating feature 368, there is no seam formed in the insulating material layer 370 near the upper portion of the cut opening 52. In some embodiments, the material and the formation method used for the insulating material layer 370 are the same as or similar to those used for the insulating material layer 66 shown in FIG. 2E. That is, the material of the insulating material layer 370 is the same as or similar to that of the insulating liner layer 360, so that the insulating liner layer 360 (not indicated in FIG. 5C) is merged with the insulating material layer 370.

Figure 5D:
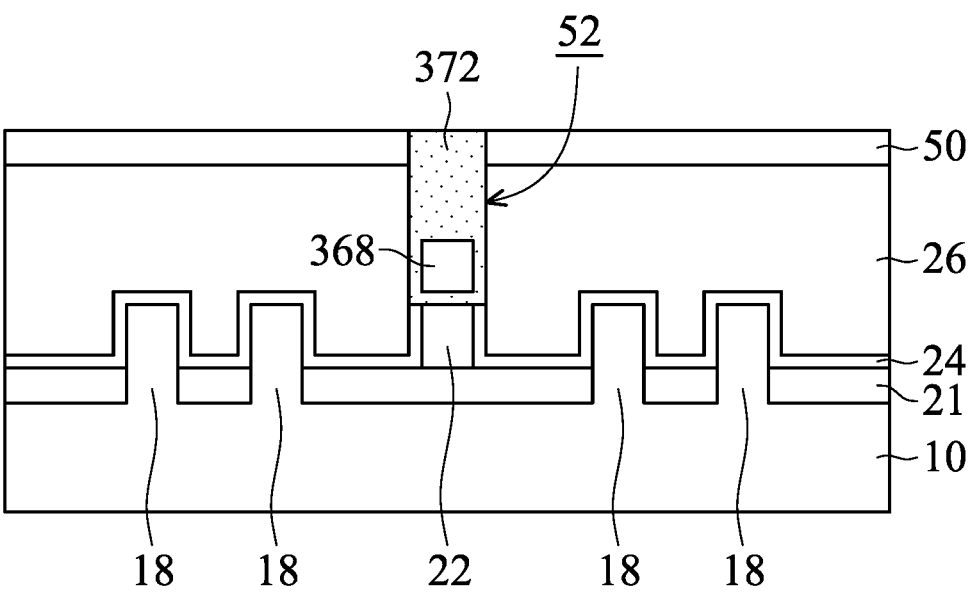

Afterwards, the insulating material layer 370 and the insulating liner layer 360 over the masking layer 50 are successively removed by a planarization process (e.g., chemical mechanical polish (CMP)) or an etching process (such as a dry etching process or a wet etching process), as shown in FIG. 5D in accordance with some embodiments. As a result, the top surface of the masking layer 50 is exposed. Moreover, a portion of the insulating material layer 370 with being merged insulating liner layer 360 (not indicated in FIG. 5D) remains in the cut opening 52. The remaining insulating material layer 370 with being merged insulating liner layer 360 in the upper portion of the cut opening 52 forms an insulating feature 372 (which is also referred to as isolation layer) to serve as a portion of the multilayer gate isolation structure. Further, the remaining insulating liner layer 360 (not indicated in FIG. 5D) forms an insulating feature 262 (which is also referred to as isolation layer or isolation liner). The insulating feature 368 surrounded by or within the remaining insulating liner layer 360 in the lower portion of the cut opening 52 serves as a portion of the multilayer gate isolation structure. Accordingly, the stack of the insulating feature 22, the insulating feature 368 surrounded by or within the remaining insulating liner layer 360, and the insulating feature 372 form a multilayer gate isolation structure 374 (as indicated in FIG. 5E) to separate the two portions of the dummy gate structure.

Figure 5E:
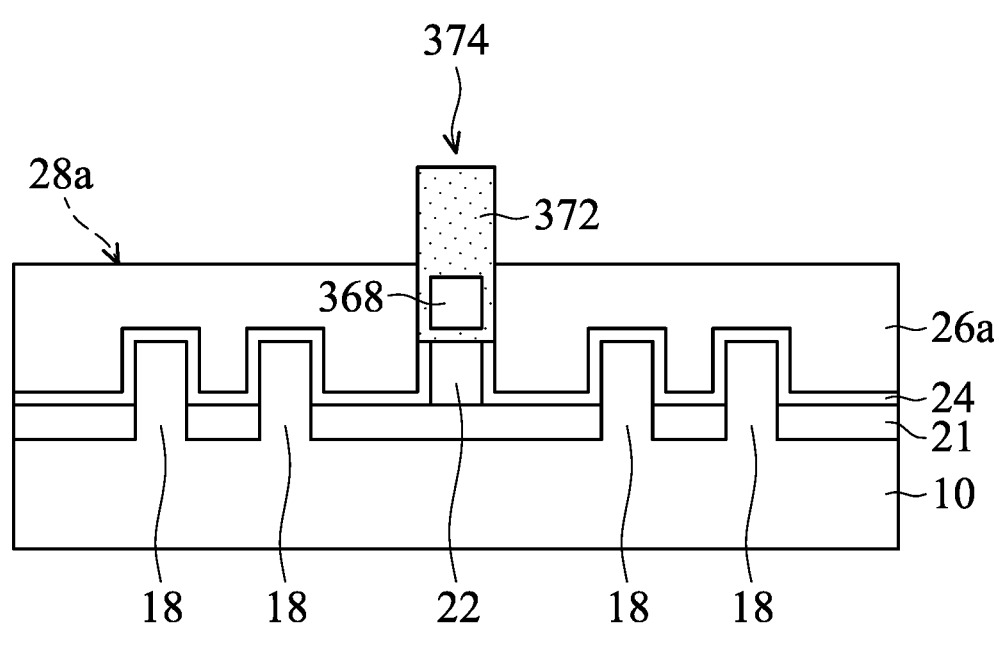

Afterwards, in some embodiments, the masking layer 50 and a portion of the dummy gate electrode layer 26 are successively removed, as shown in FIG. 5E. In some embodiments, the method used for the removal of the masking layer 50 and a portion of the dummy gate electrode layer 26 is the same as the method shown in FIG. 2G. Afterwards, the gate spacers 28 (not shown in FIG. 5E and indicated by FIG. 1H) on opposite sides of the dummy gate structure and above the remaining dummy gate electrode layer 26a are removed by performing the spacer pull-back etching process.

Figure 5F:
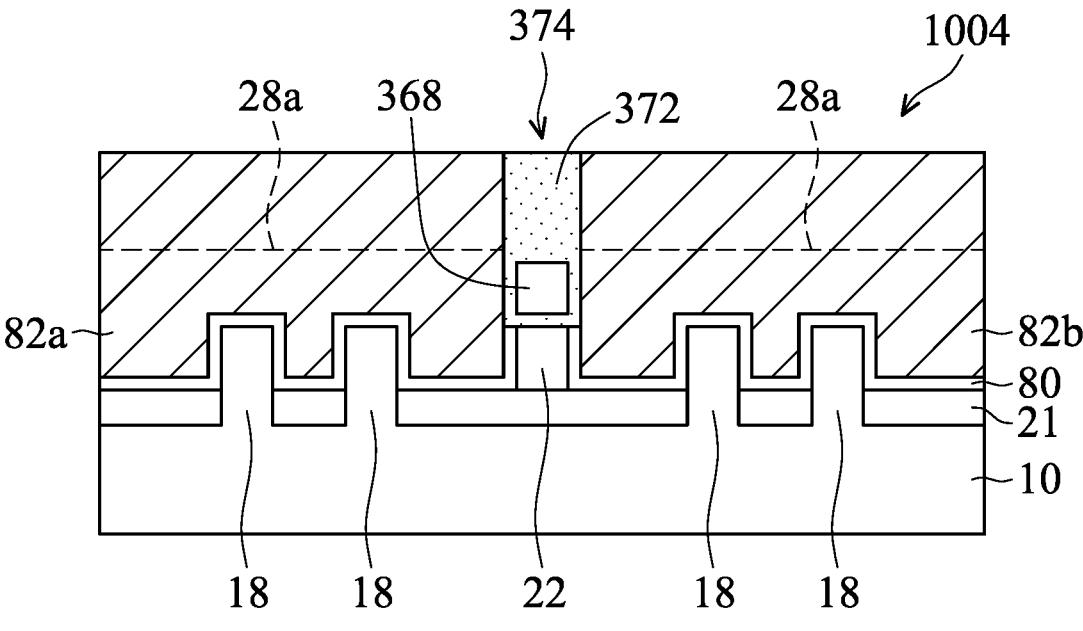

Afterwards, the dummy gate structure including the dummy gate dielectric layer 24 and two portions of the dummy gate electrode layer 26a are replaced by an active gate structure as shown in FIG. 5F in accordance with some embodiments. For example, the method used for replacing the dummy gate structure with the active gate structure may be the same as the method shown in FIGS. 2H to 2I.

Although FIGS. 2A to 2I illustrate the formation of a semiconductor device structure 1001 with the multilayer gate isolation structure 70 and FIGS. 4A to 4F illustrate the formation of a semiconductor device structure 1003 with the multilayer gate isolation structure 274, embodiments of the disclosure are not limited thereto. Many variations and/or modifications can be made to embodiments of the disclosure.

Figure 6A:
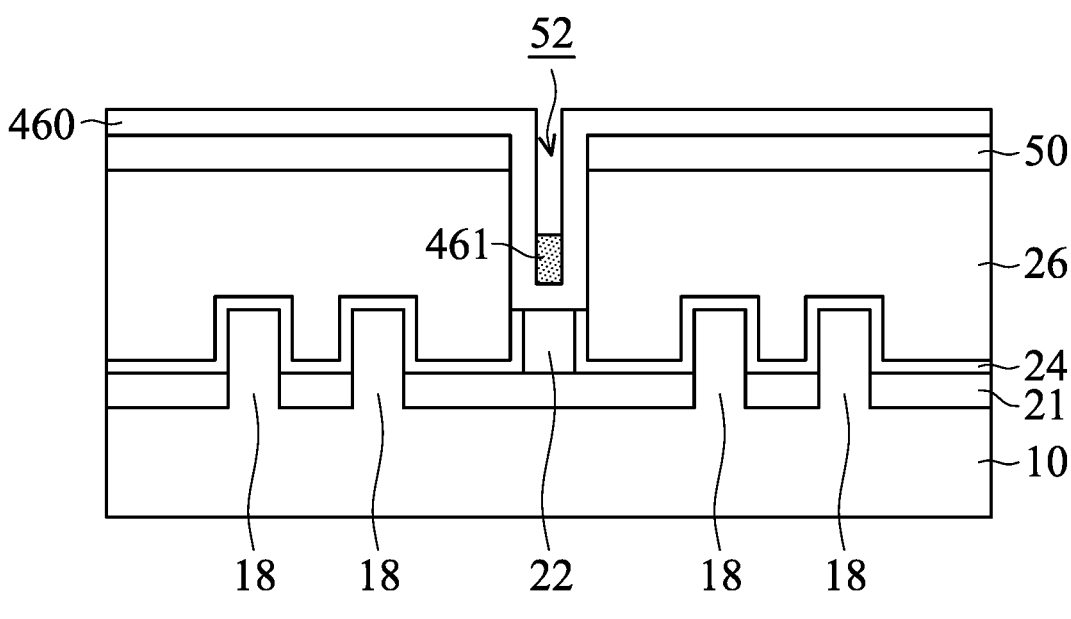
FIGS. 6A to 6G show cross-sectional views of various stages of forming a semiconductor device structure with a multilayer gate isolation structure separating FinFET transistor structures, in accordance with some embodiments.

FIGS. 6A to 6G are cross-sectional views of various stages of forming a semiconductor device structure 1005 in accordance with some embodiments. Elements in FIGS. 6A to 6G that are the same as or similar to those in FIGS. 1A to 1H, 2A to 2I and 4A to 4F are labeled with the same reference numbers as in FIGS. 1A to 1H, 2A to 2I and 4A to 4F and may be not described again for brevity. A structure similar to the structure shown in FIG. 4B is provided or formed in accordance with some embodiments. Similar to the arrangement of the insulating liner layer 260 and the insulating feature 268 in the structure shown in FIG. 4B, an insulating liner layer 460 is conformally formed over the masking layer 50 and conformally fill the cut opening 52, and a masking layer 461 is formed in the lower portion of the cut opening 52, as shown in FIG. 6A in accordance with some embodiments. In some embodiments, the formation method used for the insulating material layer 460 is the same as or similar to that used for the insulating liner layer 260 shown in FIG. 4A. However, unlike to the insulating liner layer 260 shown in FIG. 4A, the insulating liner layer 460 is made of a material that is the same as or similar to that of the insulating material layer 60 shown in FIG. 2C or that of the insulating material layer 266 shown in FIG. 4A. In some embodiments, unlike to the insulating feature 268 shown in FIG. 4B, the masking layer 461 is made of a resist layer that is formed by a lithography process. The masking layer 461 is formed in the lower portion of the cur opening 52 to partially expose the insulating liner layer 460. For example, the insulating liner layer 460 formed over the masking layer 50 and in the upper portion of the cut opening 52 is exposed from the masking layer 461.

Figure 6B:
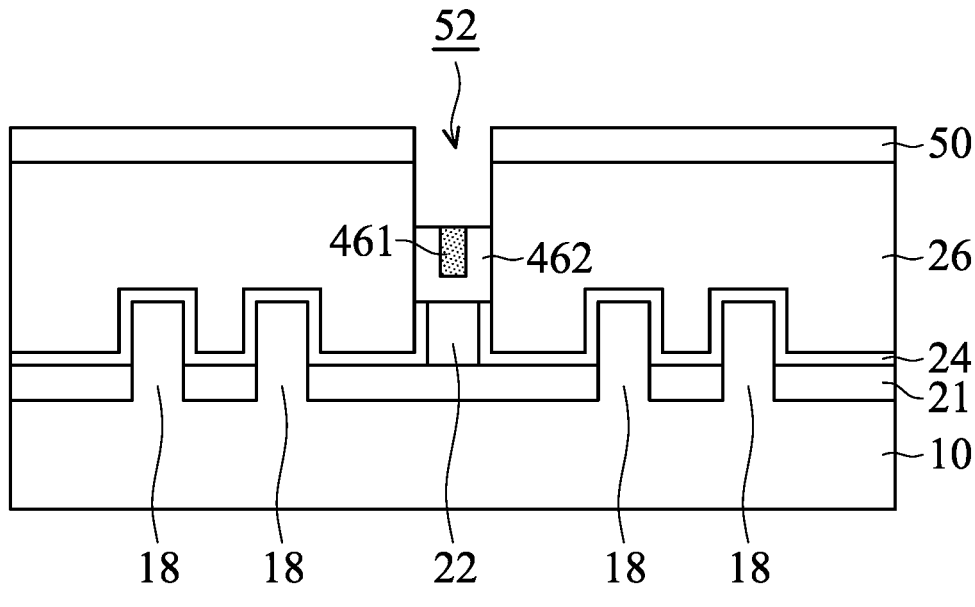

Afterwards, the insulating liner layer 460 is etched using the masking layer 50 and the masking layer 461 as an etch mask, as shown in FIG. 6B in accordance with some embodiments. As a result, the insulating liner layer 360 on the masking layer 50 and on the sidewalls of the upper portion of the cut opening 52 is removed. Further, a portion of the insulating liner layer 460 remains in the lower portion of the cut opening 52. The remaining insulating liner layer 460 forms an insulating feature 462 (which is also referred to as isolation layer) surrounding the masking layer 461, to serve as a portion of the multilayer gate isolation structure.

Figure 6C:
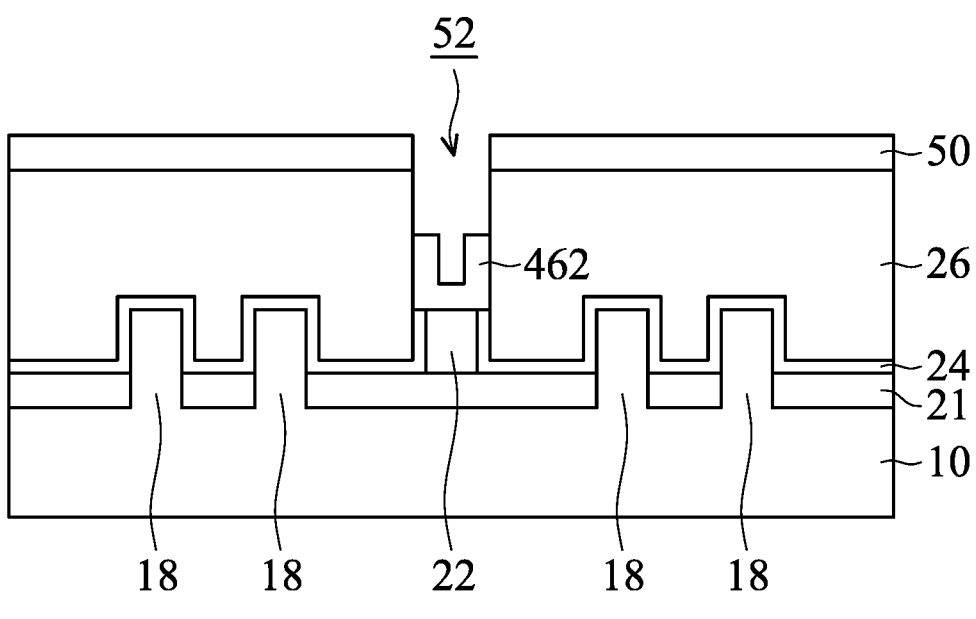

After the insulating feature 462 is formed, the masking layer 461 (shown in FIG. 6B) is removed to form a recess in the insulating feature 462, as shown in FIG. 6C in accordance with some embodiments. For example, the masking layer 461 made of a resist material may be removed by an ashing process or a wet striping process.

Afterwards, the cut opening 52 is filled with an insulating layer 466 for formation of the multilayer gate isolation structure, as shown in FIG. 6C in accordance with some embodiments. More specifically, the insulating material layer 466 is formed over the masking layer 50 and fully fills the upper portion of the cut opening 52. As a result, the recess in the insulating feature 462 is capped by the insulating material layer 466 to form an air gap 462a in the insulating feature 462. The air gap 462a may reduce the dielectric constant of the subsequently formed multilayer gate isolation structure, thereby reducing the parasitic capacitance between the subsequently formed gate electrode layers on both sides (or opposite sides) of the subsequently formed multilayer gate isolation structure. In some embodiments, the material and the formation method used for the insulating material layer 466 are the same as or similar to those used for the insulating material layer 66 shown in FIG. 2E or those used for the insulating material layer 270 shown in FIG. 4C.

Figure 6D:
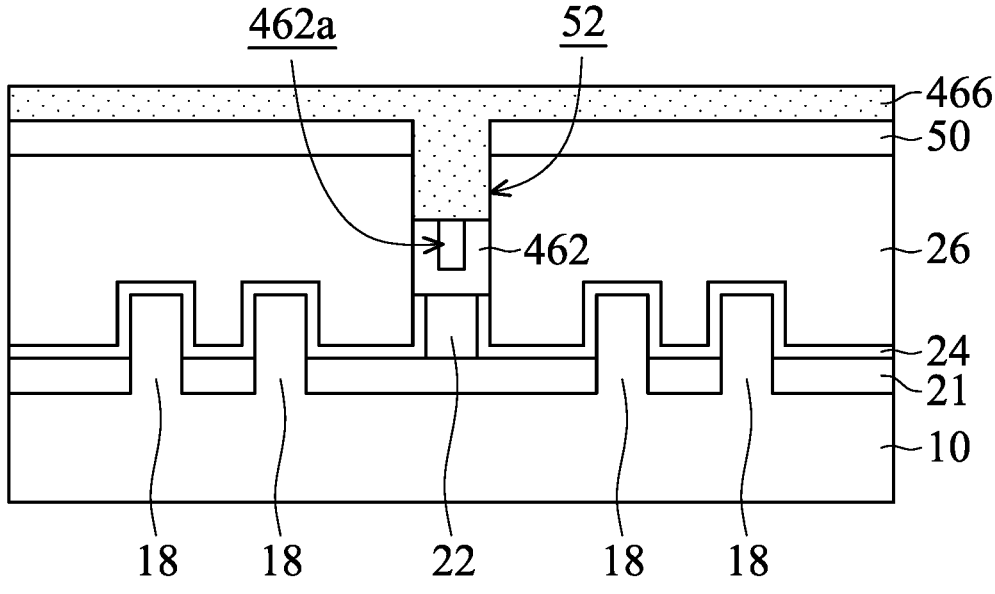
Figure 6E:
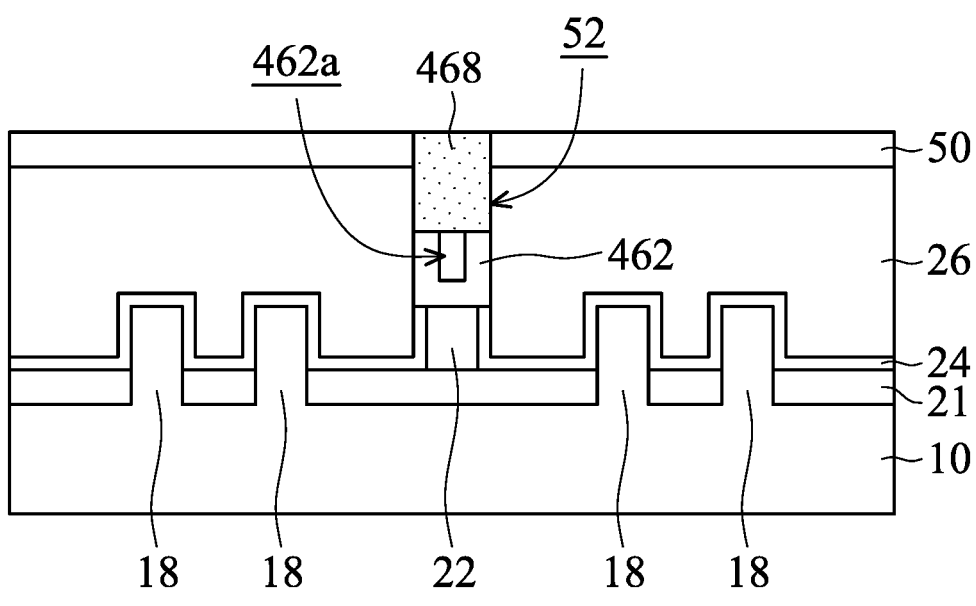

Afterwards, the insulating material layer 466 over the masking layer 50 is removed by a planarization process (e.g., chemical mechanical polish (CMP)) or an etching process (such as a dry etching process or a wet etching process), as shown in FIG. 6D in accordance with some embodiments. As a result, the top surface of the masking layer 50 is exposed. Moreover, a portion of the insulating material layer 466 remains in the upper portion of the cut opening 52. The remaining insulating material layer 466 forms an insulating feature 468 (which is also referred to as isolation layer) to serve as a portion of the multilayer gate isolation structure. Accordingly, the stack of the insulating feature 22, the insulating feature 462, the air gap 462a, and the insulating feature 468 form a multilayer gate isolation structure 470 (as indicated in FIG. 6F) to separate the two portions of the dummy gate structure.

Figure 6F:
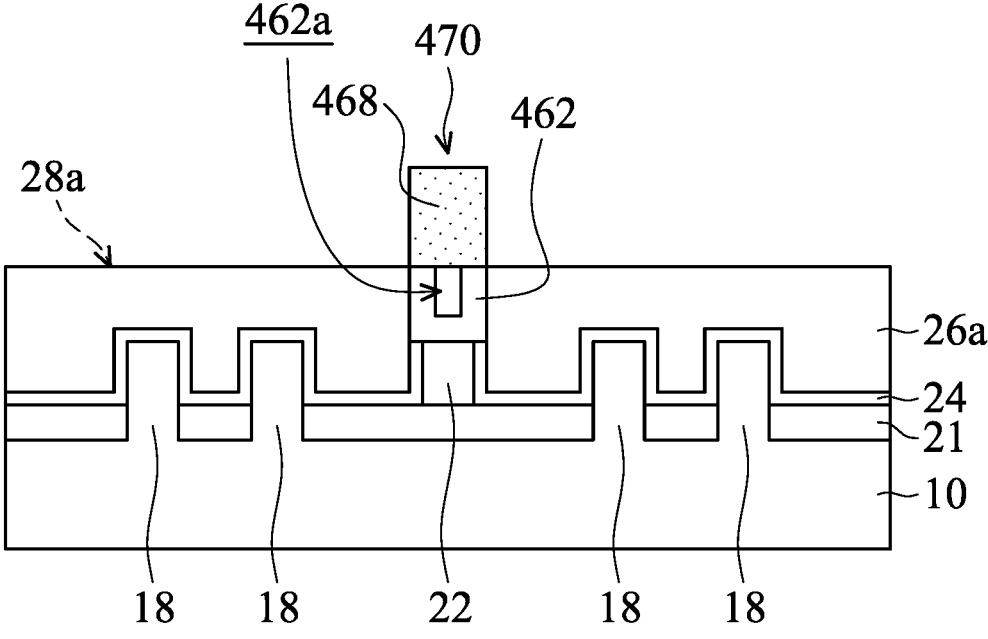

Afterwards, in some embodiments, the masking layer 50 and a portion of the dummy gate electrode layer 26 are successively removed, as shown in FIG. 6F. In some embodiments, the method used for the removal of the masking layer 50 and a portion of the dummy gate electrode layer 26 is the same as the method shown in FIG. 2G. Afterwards, the gate spacers 28 (not shown in FIG. 6F and indicated by FIG. 1H) on opposite sides of the dummy gate structure and above the remaining dummy gate electrode layer 26a are removed by performing the spacer pull-back etching process.

Figure 6G:
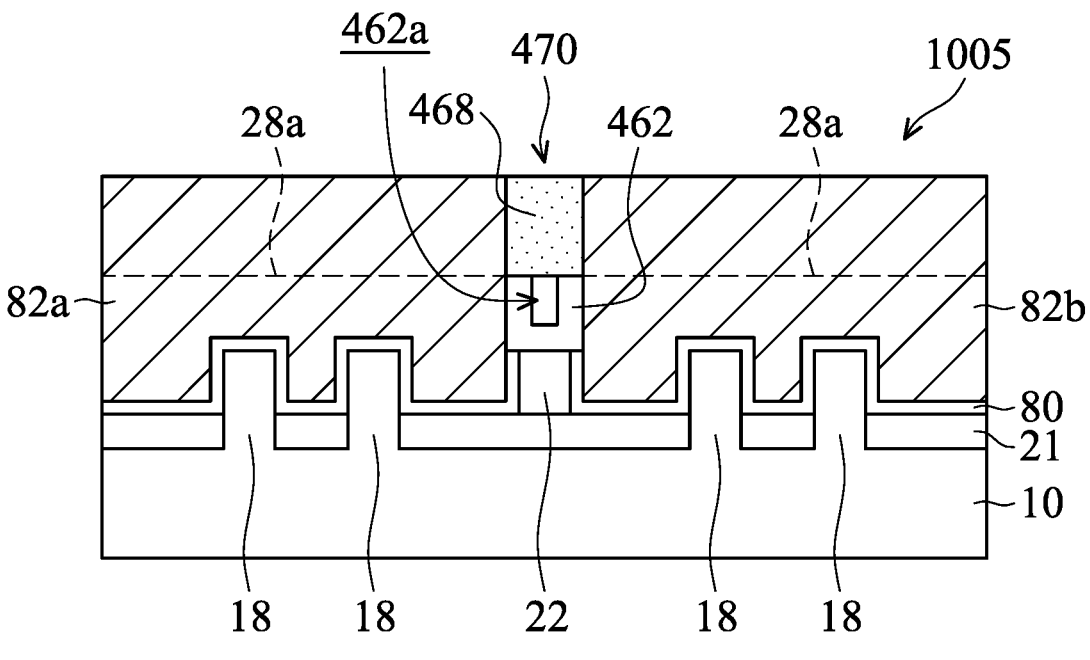

Afterwards, the dummy gate structure including the dummy gate dielectric layer 24 and two portions of the dummy gate electrode layer 26a are replaced by an active gate structure as shown in FIG. 6G in accordance with some embodiments. For example, the method used for replacing the dummy gate structure with the active gate structure may be the same as the method shown in FIGS. 2H to 2I.

Although FIGS. 2I, 3E, 4F, 5F, and 6G illustrate various semiconductor device structures 1001 to 1005 with FinFET transistor structures, embodiments of the disclosure are not limited thereto. Many variations and/or modifications can be made to embodiments of the disclosure.

Figure 7:
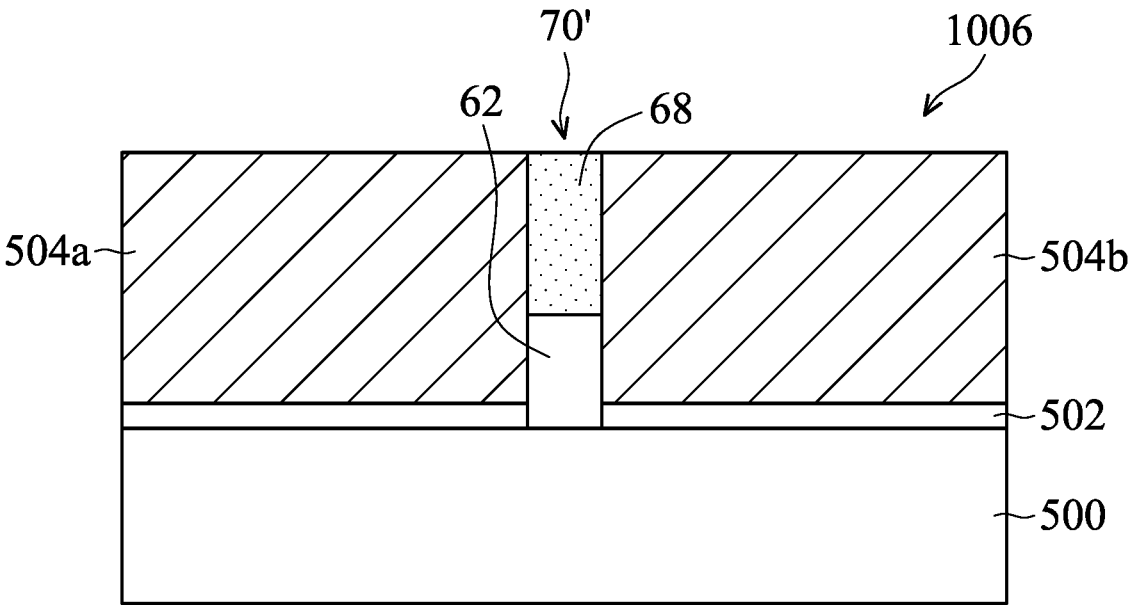
FIG. 7 shows a cross-sectional view of a semiconductor device structure with a multilayer gate isolation structure separating planar transistor structures, in accordance with some embodiments.

FIG. 7 illustrates a cross-sectional view of semiconductor device structure with a multilayer gate isolation structure separating planar transistor structures. FIGS. 8, 9, 10, and 11 illustrate cross-sectional views of various semiconductor device structures with a multilayer gate isolation structure separating GAA transistor structures.

As shown in FIG. 7, the semiconductor device structure 1006 includes planar transistor structures. In some embodiments, each of the planar transistor structures includes a semiconductor substrate 500, a gate dielectric layer 502 formed over the semiconductor substrate 500, and a gate electrode layer 504a or 504b formed over the gate dielectric layer 502. In some embodiments, the gate structure including the gate dielectric layer 502 and the gate electrode layer 504a is separated from the gate structure including the gate dielectric layer 502 and the gate electrode layer 504b by a multilayer gate isolation structure 70'. In some embodiments, the structure of the multilayer gate isolation structure 70' is the same as the structure of the multilayer gate isolation structure 70 shown in FIG. 2I expect the insulating feature 22. More specifically, the multilayer gate isolation structure 70' includes the stack of the insulating feature 62 and the overlying insulating feature 68. The multilayer gate isolation structure 70' formed over the semiconductor substrate 500 to separate the gate electrode layers 504a and 504b from each other. In some embodiments, the material and the formation method used for the multilayer gate isolation structure 70' are the same as or similar to those used for the multilayer gate isolation structure 70 shown in FIG. 2I.

Although FIG. 7 illustrates the semiconductor device structure 1006 with the multilayer gate isolation structure 70' including the stack of the insulating feature 62 and the overlying insulating feature 68, embodiments of the disclosure are not limited thereto. Many variations and/or modifications can be made to embodiments of the disclosure. In some embodiments, the multilayer gate isolation structure 70' is replaced by the multilayer gate isolation structure 170 shown in FIG. 3E without the insulating feature 22. Alternatively, the multilayer gate isolation structure 70' is replaced by the multilayer gate isolation structure 274 shown in FIG. 4F without the insulating feature 22. In some other embodiments, the multilayer gate isolation structure 70' is replaced by the multilayer gate isolation structure 374 shown in FIG. 5F without the insulating feature 22. Alternatively, the multilayer gate isolation structure 70' is replaced by the multilayer gate isolation structure 470 shown in FIG. 6G without the insulating feature 22.

Figure 8:
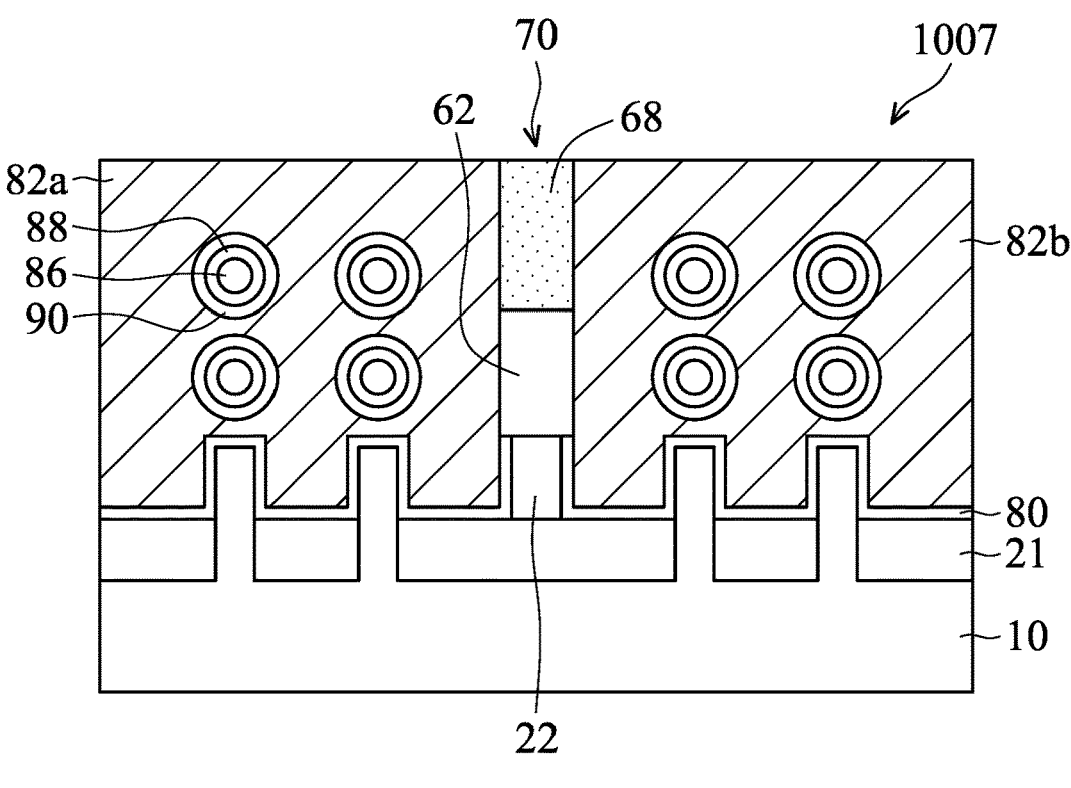
FIG. 8 shows a cross-sectional view of a semiconductor device structure with a multilayer gate isolation structure separating GAA transistor structures, in accordance with some embodiments.

As shown in FIG. 8, the semiconductor device structure 1007 includes GAA transistor structures. Elements in FIG. 8 that are the same as or similar to those in FIG. 2I are labeled with the same reference numbers as in FIG. 2I and may be not described again for brevity. In some embodiments, each of the GAA transistor structures includes a semiconductor substrate 10, a gate dielectric layer 80 formed over the semiconductor substrate 10, a gate electrode layer 82a or 82b formed over the gate dielectric layer 502, and a channel feature formed in and surrounded by the gate electrode layer 82a or 82b.

In some embodiments, the channel feature includes nano-structures (e.g., nanowires that are in cylindrical form). For example, a first nanowire and an adjacent second nanowire may be arranged side by side and surrounded by the gate electrode layer 82a (or gate electrode layer 82b), and a third nanowire and an adjacent fourth nanowire may also be arranged side by side and surrounded by the gate electrode layer 82a (or gate electrode layer 82b). Further, the third nanowire and the fourth nanowire are vertically aligned with the overlying first nanowire and the overlying second nanowire, respectively. In some embodiments, each of the first, second, third, and fourth nanowires includes a wire portion 86 that successively surrounded by an interfacial layer 88, a gate dielectric layer 90 and the gate electrode layer 82a (or gate electrode layer 82b). For example, the wire portion 86 may be made of silicon or silicon germanium. Further, the interfacial layer 88 may be made of oxide. In addition, the gate dielectric layer 90 may be made of a material that is the same as that of the gate dielectric layer 80 and formed together with the gate dielectric layer 80. A work functional metal layer (not shown) may be formed between the gate dielectric layer 90 and the gate electrode layer 82a (or gate electrode layer 82b), as the work functional metal layer formed between the gate dielectric layer 80 and the gate electrode layer 82a (or gate electrode layer 82b) described in FIG. 2I. In some embodiments, each of the first, second, third, and fourth nanowires has the same conductivity type (e.g., n-type or p-type).

In some embodiments, the gate structure including the gate dielectric layers 80 and 90 and the gate electrode layer 82a is separated from the gate structure including the gate dielectric layers 80 and 90 and the gate electrode layer 82b by a multilayer gate isolation structure 70 that is the same as the multilayer gate isolation structure 70 shown in FIG. 2I. In some embodiments, the material and the formation method used for the multilayer gate isolation structure 70 are the same as or similar to those used for the multilayer gate isolation structure 70 shown in FIG. 2I.

Although FIG. 8 illustrates the semiconductor device structure 1007 with the multilayer gate isolation structure 70, embodiments of the disclosure are not limited thereto. Many variations and/or modifications can be made to embodiments of the disclosure. In some embodiments, the multilayer gate isolation structure 70 is replaced by the multilayer gate isolation structure 170 shown in FIG. 3E. Alternatively, the multilayer gate isolation structure 70 is replaced by the multilayer gate isolation structure 274 shown in FIG. 4F. In some other embodiments, the multi-layer gate isolation structure 70 is replaced by the multilayer gate isolation structure 374 shown in FIG. 5F. Alternatively, the multilayer gate isolation structure 70 is replaced by the multilayer gate isolation structure 470 shown in FIG. 6G.

Figure 9:
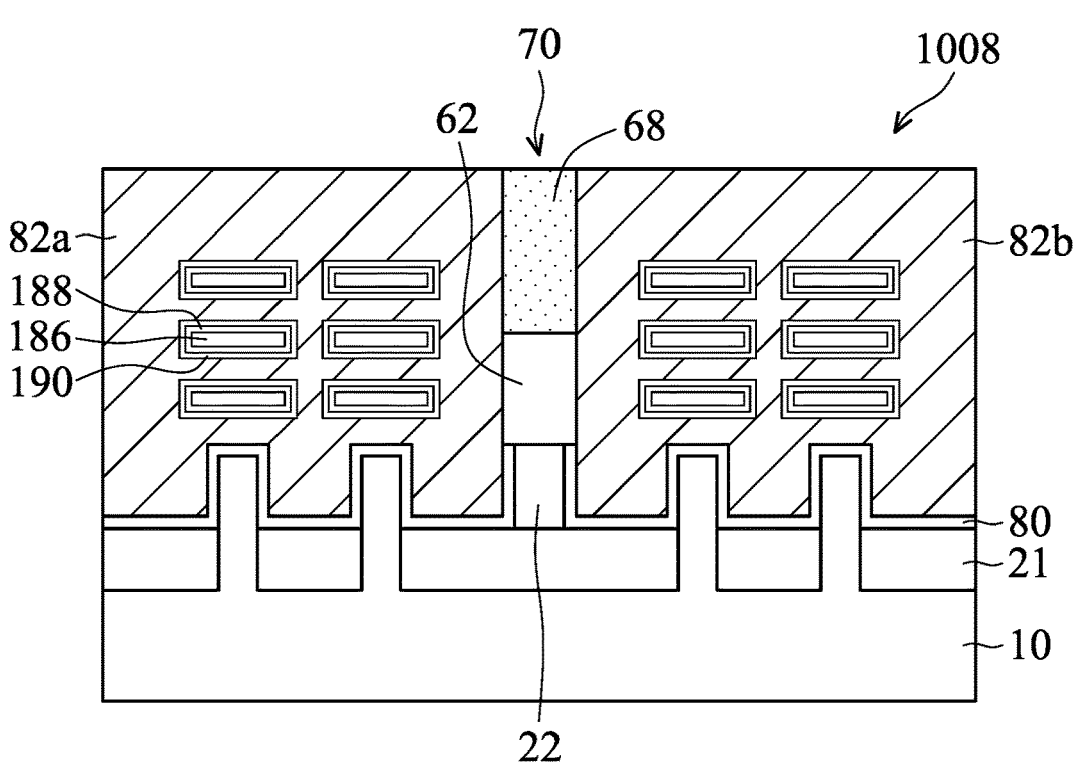
FIG. 9 shows a cross-sectional view of a semiconductor device structure with a multilayer gate isolation structure separating GAA transistor structures, in accordance with some embodiments.

As shown in FIG. 9, the semiconductor device structure 1008 also includes GAA transistor structures. Elements in FIG. 9 that are the same as or similar to those in FIG. 8 are labeled with the same reference numbers as in FIG. 8 and may be not described again for brevity. In some embodiments, the structure of the semiconductor device structure 1008 is similar to the structure of the semiconductor device structure 1007 shown in FIG. 8. The difference is the channel feature in the semiconductor device structure 1008 includes nanosheets, rather than nanowires. For example, a first nanosheet and an adjacent second nanosheet may be arranged side by side and surrounded by the gate electrode layer 82a (or gate electrode layer 82b), a third nanosheet and an adjacent fourth nanosheet may also be arranged side by side and surrounded by the gate electrode layer 82a (or gate electrode layer 82b), and a fifth nanosheet and an adjacent sixth nanosheet may also be arranged side by side and surrounded by the gate electrode layer 82a (or gate electrode layer 82b). Further, the third nanosheet and the fourth nanosheet are vertically aligned with the overlying first nanosheet and the overlying second nanosheet, respectively. The fifth nanosheet and the sixth nanosheet are vertically aligned with the overlying third nanosheet and the overlying fourth nanosheet, respectively. In some embodiments, each of those nanosheets includes a sheet portion 186 that successively surrounded by an interfacial layer 188, a gate dielectric layer 190 and the gate electrode layer 82a (or gate electrode layer 82b). For example, the sheet portion 186 may be made of a material that is the same as or similar to that of the wire portion 86 shown in FIG. 8. Similarly, the interfacial layer 188 may be made of a material that is the same as or similar to that of the interfacial layer 88 shown in FIG. 8. Further, the gate dielectric layer 190 may be made of a material that is the same as that of the gate dielectric layer 80 and formed together with the gate dielectric layer 80.

In some embodiments, the gate structure including the gate dielectric layers 80 and 190 and the gate electrode layer 82a is separated from the gate structure including the gate dielectric layers 80 and 190 and the gate electrode layer 82b by a multilayer gate isolation structure 70.

Although FIG. 9 illustrates the semiconductor device structure 1008 with the multilayer gate isolation structure 70, embodiments of the disclosure are not limited thereto. Many variations and/or modifications can be made to embodiments of the disclosure. In some embodiments, the multilayer gate isolation structure 70 is replaced by the multilayer gate isolation structure 170 shown in FIG. 3E. Alternatively, the multilayer gate isolation structure 70 is replaced by the multilayer gate isolation structure 274 shown in FIG. 4F. In some other embodiments, the multi-layer gate isolation structure 70 is replaced by the multilayer gate isolation structure 374 shown in FIG. 5F. Alternatively, the multilayer gate isolation structure 70 is replaced by the multilayer gate isolation structure 470 shown in FIG. 6G.

Figure 10:
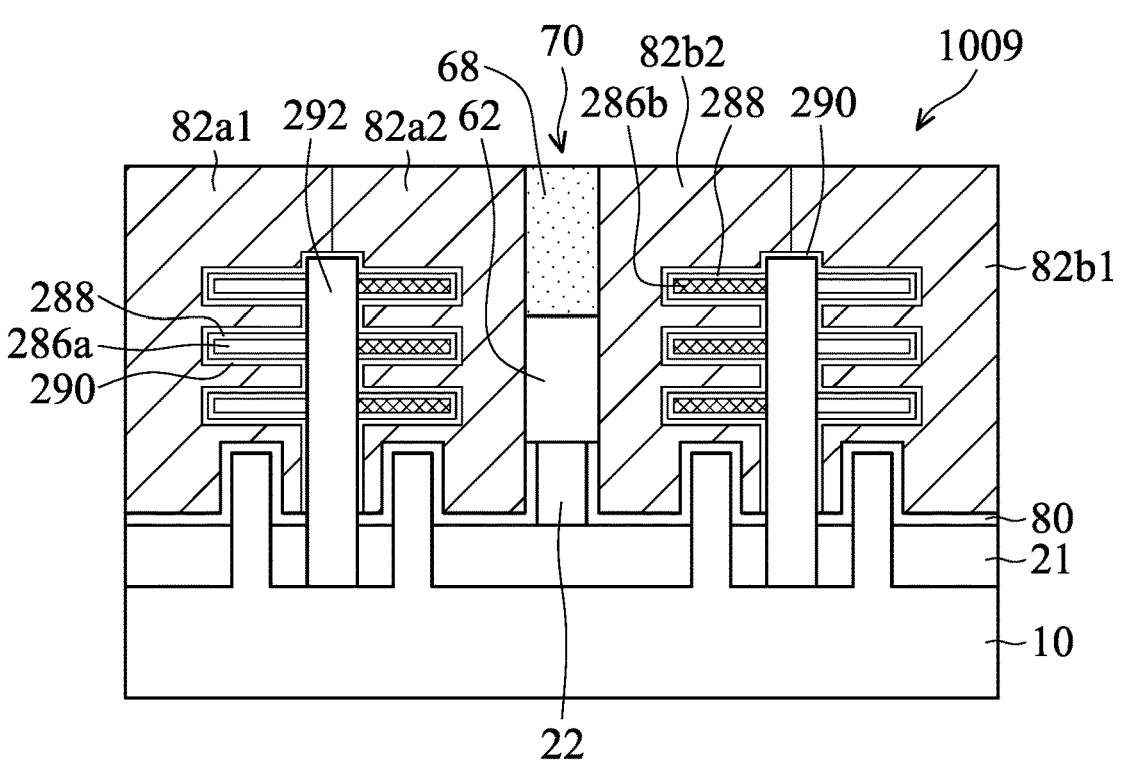
FIG. 10 shows a cross-sectional view of a semiconductor device structure with a multilayer gate isolation structure separating GAA transistor structures, in accordance with some embodiments.

As shown in FIG. 10, the semiconductor device structure 1009 also includes GAA transistor structures. Elements in FIG. 10 that are the same as or similar to those in FIG. 9 are labeled with the same reference numbers as in FIG. 9 and may be not described again for brevity. In some embodiments, the structure of the semiconductor device structure 1009 is similar to the structure of the semiconductor device structure 1008 shown in FIG. 9. The difference is the channel feature in the semiconductor device structure 1009 includes an isolation wall separating nanosheets with different conductivity types (e.g., n-type and p-type). Moreover, there are gate electrode layers with different conductivity types (e.g., n-type and p-type) on opposite sides of the isolation wall. For example, a first nanosheet and an adjacent second nanosheet may be arranged side by side and isolated from each other by an isolation wall 292 that extends from the gate dielectric layer 80 into the adjacent gate electrode layers 82*a1* and 82*a2* (or adjacent gate electrode layers 82*b1* and 82*b2*) and the underlying isolation structure 21. In some embodiments, the gate electrode layers 82*a1* and 82*b1* have the same first conductivity type and the gate electrode layers 82*a2* and 82*b2* have the same second conductivity type that is the opposite of that of the gate electrode layers 82*a1* and 82*b1*. For example, the gate electrode layers 82*a1* and 82*b1* includes first conductivity type (e.g., n-type) work function metal layer to form first conductivity type gate electrode layers. Moreover, the gate electrode layers 82*a2* and 82*b2* includes second conductivity type (e.g., p-type) work function metal layer to form second conductivity type gate electrode layers.

Similarly, a third nanosheet and an adjacent fourth nanosheet may also be arranged side by side and isolated from each other by an isolation wall 292, and a fifth nanosheet and an adjacent sixth nanosheet may also be arranged side by side and isolated from each other by an isolation wall 292. Further, the third nanosheet and the fourth nanosheet are vertically aligned with the overlying first nanosheet and the overlying second nanosheet, respectively. The fifth nanosheet and the sixth nanosheet are vertically aligned with the overlying third nanosheet and the overlying fourth nanosheet, respectively. In some embodiments, each of the first, third and fifth nanosheets includes a sheet portion 286*a* that successively surrounded by an interfacial layer 288, a gate dielectric layer 290 and the gate electrode layer 82*a1* (or gate electrode layer 82*b1*). Similarly, each of the second, fourth and sixth nanosheets includes a sheet portion 286*b* that successively surrounded by an interfacial layer 288, a gate dielectric layer 290 and the gate electrode layer 82*a2* (or gate electrode layer 82*b2*). In some embodiments, the conductivity types of the sheet portion 286*a* and the gate electrode layer 82*a1* (or the gate electrode layer 82*b1*) are the opposite of those of the sheet portion 286*b* and the gate electrode layer 82*a2* (or the gate electrode layer 82*b2*). For example, the sheet portion 286*a* and the gate electrode layer 82*a1* (or the gate electrode layer 82*b1*) may be n-type, and the sheet portion 286*b* and the gate electrode layer 82*a2* (or the gate electrode layer 82*b2*) may be p-type. Alternatively, the sheet portion 286*a* and the gate electrode layer 82*a1* (or the gate electrode layer 82*b1*) may be p-type, and the sheet portion 286*b* and the gate electrode layer 82*a2* (or the gate electrode layer 82*b2*) may be n-type. The sheet portions 286*a* and 286*b* may be made of a material that is the same as or similar to that of the sheet portion 186 shown in FIG. 9. Similarly, the interfacial layer 288 may be made of a material that is the same as or similar to that of the interfacial layer 188 shown in FIG. 9. Further, the gate dielectric layer 290 may be made of a material that is the same as that of the gate dielectric layer 80 and formed together with the gate dielectric layer 80.

In some embodiments, the gate structure including the gate dielectric layers 80 and 290 and the gate electrode layer 82*a* is separated from the gate structure including the gate dielectric layers 80 and 290 and the gate electrode layer 82*b* by a multilayer gate isolation structure 70.

Although FIG. 10 illustrates the semiconductor device structure 1009 with the multilayer gate isolation structure 70, embodiments of the disclosure are not limited thereto. Many variations and/or modifications can be made to embodiments of the disclosure. In some embodiments, the multilayer gate isolation structure 70 is replaced by the multilayer gate isolation structure 170 shown in FIG. 3E.

Alternatively, the multilayer gate isolation structure 70 is replaced by the multilayer gate isolation structure 274 shown in FIG. 4F. In some other embodiments, the multilayer gate isolation structure 70 is replaced by the multilayer gate isolation structure 374 shown in FIG. 5F. Alternatively, the multilayer gate isolation structure 70 is replaced by the multilayer gate isolation structure 470 shown in FIG. 6G.

Figure 11:
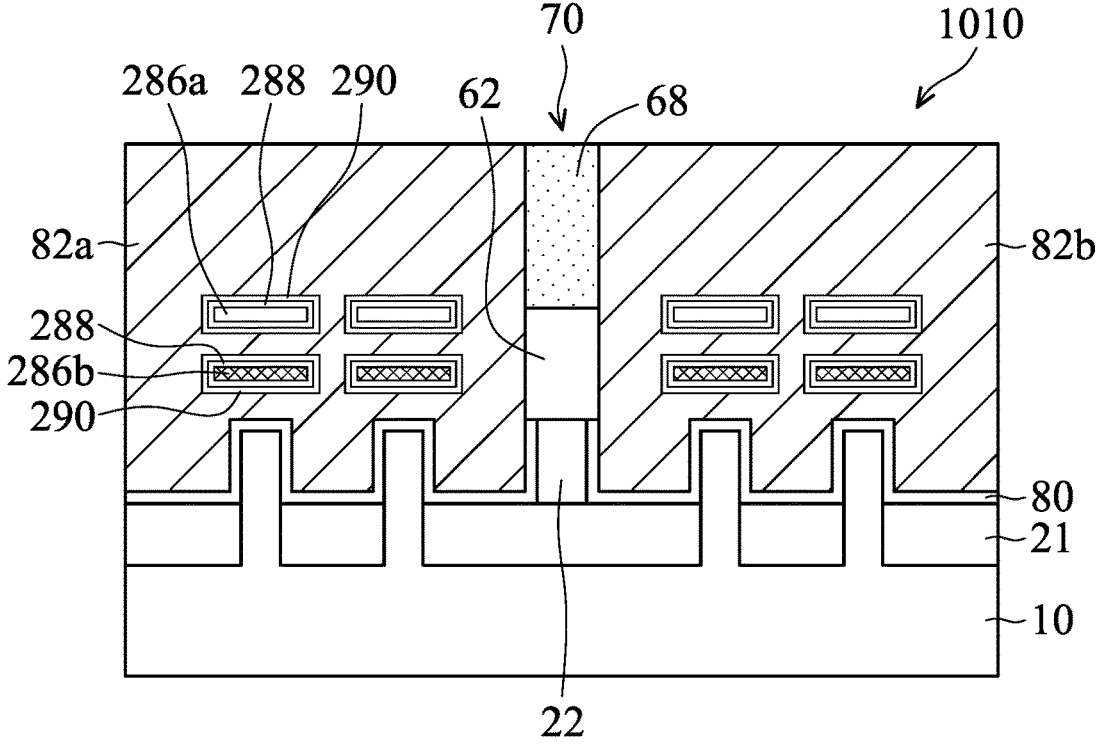
FIG. 11 shows a cross-sectional view of a semiconductor device structure with a multilayer gate isolation structure separating GAA transistor structures, in accordance with some embodiments.

As shown in FIG. 11, the semiconductor device structure 1010 also includes GAA transistor structures. Elements in FIG. 11 that are the same as or similar to those in FIG. 9 are labeled with the same reference numbers as in FIG. 9 and may be not described again for brevity. In some embodiments, the structure of the semiconductor device structure 1010 is similar to the structure of the semiconductor device structure 1008 shown in FIG. 9. The difference is the channel feature in the semiconductor device structure 1010 includes nanosheets with different conductivity types (e.g., n-type and p-type) that are formed in the gate electrode layer 82*a* (or gate electrode layer 82*b*). For example, a first nanosheet and an adjacent second nanosheet may be arranged side by side and surrounded by the gate electrode layer 82*a* (or gate electrode layer 82*b*). Similarly, a third nanosheet and an adjacent fourth nanosheet may also be arranged side by side and surrounded by the gate electrode layer 82*a* (or gate electrode layer 82*b*). Further, the third nanosheet and the fourth nanosheet are vertically aligned with the overlying first nanosheet and the overlying second nanosheet, respectively. In some embodiments, each of the first and second nanosheets includes a sheet portion 286*a* that successively surrounded by an interfacial layer 288, a gate dielectric layer 290 and the gate electrode layer 82*a* (or gate electrode layer 82*b*). Similarly, each of the third and fourth nanosheets includes a sheet portion 286*b* that successively surrounded by the interfacial layer 288, the gate dielectric layer 290 and the gate electrode layer 82*a* (or gate electrode layer 82*b*). In some embodiments, the conductivity type of the sheet portion 286*a* is the opposite of that of the sheet portion 286*b*. For example, the sheet portion 286*a* may be n-type and the sheet portion 286*b* may be p-type. Alternatively, the sheet portion 286*a* may be p-type and the sheet portion 286*b* may be n-type. The sheet portions 286*a* and 286*b* may be made of a material that is the same as or similar to that of the sheet portion 186 shown in FIG. 9. Similarly, the interfacial layer 288 may be made of a material that is the same as or similar to that of the interfacial layer 188 shown in FIG. 9. Further, the gate dielectric layer 290 may be made of a material that is the same as that of the gate dielectric layer 80 and formed together with the gate dielectric layer 80.

In some embodiments, the gate structure including the gate dielectric layers 80 and 290 and the gate electrode layer 82*a* is separated from the gate structure including the gate dielectric layers 80 and 290 and the gate electrode layer 82*b* by a multilayer gate isolation structure 70.

Although FIG. 11 illustrates the semiconductor device structure 1009 with the multilayer gate isolation structure 70, embodiments of the disclosure are not limited thereto. Many variations and/or modifications can be made to embodiments of the disclosure. In some embodiments, the multilayer gate isolation structure 70 is replaced by the multilayer gate isolation structure 170 shown in FIG. 3E. Alternatively, the multilayer gate isolation structure 70 is replaced by the multilayer gate isolation structure 274 shown in FIG. 4F. In some other embodiments, the multilayer gate isolation structure 70 is replaced by the multilayer gate isolation structure 374 shown in FIG. 5F. Alternatively, the multilayer gate isolation structure 70 is replaced by the multilayer gate isolation structure 470 shown in FIG. 6G.

Embodiments of a semiconductor device structure and a method for forming the same are provided. The semiconductor device structure includes a first gate structure and a second gate structure formed over a semiconductor substrate, and a multilayer gate isolation structure separating the first gate structure from the second gate structure. The formation of the multilayer gate isolation structure includes forming an opening to divide a dummy gate structure into two portions. A first insulating feature and an underlying second insulating feature are formed in the opening to form the multilayer gate isolation structure. Afterwards, the two portions of the dummy gate structure are replaced with the first and second gate structures. In the multilayer gate isolation structure, the second insulating feature has a lower dielectric constant or lower etch resistance than the first insulating feature. Compared to the gate isolation structure of a single insulating material layer, the multilayer gate isolation structure provides a lower dielectric constant due to the second insulating feature having a lower dielectric constant. As a result, the parasitic capacitance between the first gate structure and the second gate structure can be reduced, thereby improving the device performance. Additionally, since the first insulating feature provides a higher etch resistance than the second insulating feature, the multilayer gate isolation structure can be endurable to the etching processes used in the formation of the semiconductor device (e.g., the spacer pull-back etching process), thereby increasing the reliability and isolation properties of the multilayer gate isolation structure. As a result, low leakage current between the semiconductor devices on both sides of the multilayer gate isolation structure can be obtained, thereby increasing the yield.

In some embodiments, a semiconductor device structure is provided. The semiconductor device structure includes a first gate structure and a second gate structure formed over a semiconductor substrate. The semiconductor device structure also includes a multilayer gate isolation structure separating the first gate structure from the second gate structure. The multilayer gate isolation structure includes a first insulating feature adjacent to the upper portion of the first gate structure and the upper portion of the second gate structure and a second insulating feature separating the semiconductor substrate from the first insulating feature. The second insulating feature comprises a different material than the material of the first insulating feature and has a lower dielectric constant or lower etch resistance than the first insulating feature.

In some embodiments, a semiconductor device structure is provided. The semiconductor device structure includes a fin extending from a semiconductor substrate and a dummy fin formed over an isolation structure around the fin. The semiconductor device structure also includes a first isolation layer formed over and aligned with the dummy fin and a second isolation layer formed over and aligned with the first isolation layer. The semiconductor device structure further includes a gate structure across the fin and having a sidewall adjacent to the dummy fin and the first isolation layer. The first isolation layer has a lower dielectric constant than the second isolation layer.

In some embodiments, a method of forming a semiconductor device structure is provided. The method includes forming an isolation structure over a semiconductor substrate and forming at least one fin or at least one nanostructure over the isolation structure to serve as a channel feature. The method also includes forming a first insulating feature over the isolation structure and adjacent to the channel feature, and forming a first gate structure across the channel feature and the first insulating feature. The method further includes forming an opening in the first gate structure to expose the top surface of the first insulating feature and divide the first gate structure into two portions. Additionally, the method includes successively forming a second insulating feature and a third insulating feature in the opening, so that the second insulating feature is in direct contact with the top surface of the first insulating feature and the bottom surface of the third insulating feature. The second insulating feature has a lower dielectric constant than the third insulating feature. The method also includes replacing the first gate structure with a second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first gate structure and a second gate structure formed over a semiconductor substrate;
    a multilayer gate isolation structure separating the first gate structure from the second gate structure, comprising:
        a first insulating feature adjacent to an upper portion of the first gate structure and an upper portion of the second gate structure; and
        a second insulating feature separating the semiconductor substrate from the first insulating feature, wherein the second insulating feature comprises a different material than that of the first insulating feature and has a lower dielectric constant or lower etch resistance than the first insulating feature; and
    a gate spacer formed adjacent to the first gate structure and the second gate structure and having a top surface lower than a top surface of the first insulating feature.

2. Semiconductor device structure as claimed in claim 1, further comprising:
    a third insulating feature adjacent to a lower portion of the first gate structure and a lower portion of the second gate structure, and below the second insulating feature, wherein the third insulating feature is separated from the first insulating feature by the second insulating feature, and
    wherein the second insulating feature separates the first insulating feature from the first gate structure and the second gate structure.

3. The semiconductor device structure as claimed in claim 1, wherein the top surface of the gate spacer is substantially level with a top surface of the second insulating feature.

4. The semiconductor device structure as claimed in claim 1, further comprising a channel feature formed in each of the first gate structure and the second gate structure.

5. The semiconductor device structure as claimed in claim 4, wherein the channel feature comprises at least one fin structure extending from the semiconductor substrate.

6. The semiconductor device structure as claimed in claim 4, wherein the channel feature comprises:

a first nanostructure and a second nanostructure arranged side by side; and a third nanostructure and a fourth nanostructure arranged side by side, wherein the third nanostructure and the fourth nanostructure are vertically aligned with the first nanostructure and the second nanostructure, respectively, and wherein the first and second nanostructures have a first conductivity type and the third and fourth nanostructures have a second conductivity type that is the same as or the opposite of the first conductivity type.

7. The semiconductor device structure as claimed in claim 4, wherein the channel feature comprises:

a first nanostructure and a second nanostructure arranged side by side and respectively in a first portion and an adjacent second portion of each of the first gate structure and the second gate structure;

a third nanostructure and a fourth nanostructure arranged side by side and respectively in the first portion and the second portion of each of the first gate structure and the second gate structure, wherein the third nanostructure and the fourth nanostructure are vertically aligned with the first nanostructure and the second nanostructure, respectively; and an isolation wall formed between the first nanostructure and the second nanostructure and between the third nanostructure and the fourth nanostructure, wherein the first and third nanostructures and the first portion of each of the first gate structure and the second gate structure have a first conductivity type and the second and fourth nanostructures and the second portion of each of the first gate structure and the second gate structure have a second conductivity type that is the opposite of the first conductivity type.

8. The semiconductor device structure as claimed in claim 1, wherein the multilayer gate isolation structure further comprises an air gap formed within the first insulating feature or the second insulating feature.

9. The semiconductor device structure as claimed in claim 1, wherein the first insulating feature comprises SiCN, SiCN:O, BN, $TaO_2$, TaON, HfON, or HfOC and the second insulating feature comprises porous $SiO_2$, porous SiCO, or $SiO_2$:F.

10. A semiconductor device structure, comprising:

a first insulating feature formed over a semiconductor substrate and having a first sidewall and a second sidewall opposite to the first sidewall;

a first gate structure formed over the semiconductor substrate and adjacent to the first sidewall of the first insulating feature;

a second insulating feature formed between the first insulating feature and the semiconductor substrate, wherein the second insulating feature has a lower surface higher than a lower surface of the first gate structure; and a gate spacer formed adjacent to the first gate structure, wherein the first gate structure protrudes above a top surface of the gate spacer.

11. The semiconductor device structure as claimed in claim 10, further comprises:

a second gate structure formed over the semiconductor substrate and adjacent to the gate spacer and the second sidewall of the first insulating feature, wherein the second gate structure protrudes above the top surface of the gate spacer; and an insulating fin formed between the second insulating feature and the semiconductor substrate.

12. The semiconductor device structure as claimed in claim 11, further comprising:

an insulating liner separating the second insulating feature from the first and second gate structures and the insulating fin.

13. The semiconductor device structure as claimed in claim 11, wherein the second insulating feature covering the first and second sidewalls of the first insulating feature and an upper surface of the insulating fin.

14. The semiconductor device structure as claimed in claim 10, wherein the second insulating feature comprises an air gap therein.

15. A semiconductor device structure, comprising:

a first isolation layer formed over a semiconductor substrate and having a first sidewall and a second sidewall opposite to the first sidewall;

a first gate structure and a second gate structure formed adjacent to the first sidewall and the second sidewall, respectively;

a second isolation layer formed over and aligned with the first isolation layer;

a third isolation layer formed over and aligned with the second isolation layer, wherein the third isolation layer has a higher dielectric constant than the second isolation layer; and a gate spacer formed adjacent to the first gate structure and the second gate structure and separated from an upper portion of the third isolation layer by upper portions of the first gate structure and the second gate structure.

16. The semiconductor device structure as claimed in claim 15, wherein a bottom and sidewalls of the third isolation layer are surrounded by the second isolation layer.

17. The semiconductor device structure as claimed in claim 16, wherein an air gap is formed in the third isolation layer and a top of the air gap is higher than a top of the second isolation layer.

18. The semiconductor device structure as claimed in claim 15, wherein the second isolation layer comprises a low-k material and an air gap formed within the low-k material.

19. The semiconductor device structure as claimed in claim 15, wherein the second isolation layer comprises a first material layer and a second material layer within the first material layer and the third isolation layer comprises the first material layer, wherein the second material layer has a lower dielectric than the first material layer.

20. The semiconductor device structure as claimed in claim 15, further comprising:

a fourth isolation layer formed between the second isolation layer and the first and second gate structures and between the first isolation layer and the second isolation layer.

* * * * *